United States Patent
Yoshida

(10) Patent No.: US 8,669,627 B2
(45) Date of Patent: Mar. 11, 2014

(54) MEMS ELEMENT AND METHOD FOR MANUFACTURING SAME

(71) Applicant: Murata Manufacturing Co., Ltd., Nagaokakyo (JP)

(72) Inventor: Junichi Yoshida, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/934,390

(22) Filed: Jul. 3, 2013

(65) Prior Publication Data

US 2013/0292783 A1 Nov. 7, 2013

Related U.S. Application Data

(60) Division of application No. 13/267,004, filed on Oct. 6, 2011, now Pat. No. 8,508,003, which is a continuation of application No. PCT/JP2010/056816, filed on Apr. 16, 2010.

(30) Foreign Application Priority Data

Apr. 24, 2009 (JP) ................................ 2009-106774

(51) Int. Cl.
*H01L 29/84* (2006.01)
(52) U.S. Cl.
USPC .......................................... 257/415; 257/414
(58) Field of Classification Search
USPC .................................................. 257/415, 414
See application file for complete search history.

(56) References Cited

U.S. PATENT DOCUMENTS

| 2003/0117257 | A1* | 6/2003 | Cunningham ................ 338/200 |
| 2003/0148550 | A1* | 8/2003 | Volant et al. ..................... 438/52 |
| 2005/0057331 | A1* | 3/2005 | Murata ........................... 335/78 |
| 2006/0170012 | A1* | 8/2006 | Larmer et al. ................. 257/252 |
| 2006/0181375 | A1* | 8/2006 | Nakatani et al. ................ 335/78 |
| 2009/0134522 | A1* | 5/2009 | Smith et al. .................... 257/769 |

OTHER PUBLICATIONS

Yoshida, "MEMS Element and Method For Manufacturing Same", U.S. Appl. No. 13/267,004, filed Oct. 6, 2011.

* cited by examiner

*Primary Examiner* — Douglas Menz
(74) *Attorney, Agent, or Firm* — Keating & Bennett, LLP

(57) ABSTRACT

An acceleration sensor is formed using an etched layer sandwiched between first and second substrates. In this case, a structure including a movable portion which is displaceable in the thickness direction of the substrates, and a support frame are formed in the etched layer. In addition, first and second fixed electrodes are formed on the first and second substrates, respectively, at a position facing the movable portion. Further, a remaining sacrificial layer is provided on the substrate by leaving a portion of a second sacrificial layer when a first sacrificial layer is entirely etched away. Therefore, when the first sacrificial layer is etched away, corrosion of the structure and the support beams is prevented because the second sacrificial layer is preferentially corroded as compared to the structure.

3 Claims, 21 Drawing Sheets

MEMS ELEMENT AND METHOD FOR MANUFACTURING SAME

BACKGROUND OF THE INVENTION

1. Field of the Invention

The present invention relates to a MEMS element formed by etching away a sacrificial layer and including a movable portion and a smooth surface member, and a method for manufacturing the same.

2. Description of the Related Art

In general, elements including a movable portion which is formed by processing a metal layer and capable of displacement in a thickness direction are known as MEMS (Micro Electro-Mechanical System) elements, such as a variable-capacitance element and a relay element. In sensors including such movable portions, a metal layer is provided on a substrate to cover a sacrificial layer. Then, the sacrificial layer is removed by a wet etching method to form a movable portion separated from the substrate (refer to, for example, Japanese Unexamined Patent Application Publication No. 2001-347500).

Acceleration sensors as the MEMS elements include a fixed electrode provided on a substrate at a position facing the movable portion so that an acceleration acting on the sensor is detected by detecting a capacitance between the movable portion and the fixed electrode.

However, in the MEMS element described in Japanese Unexamined Patent Application Publication No. 2001-347500, the movable portion may be also corroded with an etchant (etching solution) by a wet etching method for removing the sacrificial layer. In this case, there is the problem of increasing the surface roughness of the movable portion, thereby making it impossible to precisely detect a capacitance between the movable portion and the fixed electrode.

In addition, the MEMS element may further include a cover provided to cover the movable portion by a compression-bonding method (pressure-bonding method). In this case, a smooth surface member is formed by smoothing a surface of a metal layer, and a bonding film (e.g., a gold thin film) formed on the smooth surface member is adhered, under pressure, to a bonding film formed on the cover, thereby bonding together the smooth surface member and the cover. However, when the surface of the smooth surface member is corroded by the wet etching method, the bonding film of the smooth surface member and the bonding film of the cover cannot be sufficiently adhered to each other, thereby causing a problem of defective bonding.

SUMMARY OF THE INVENTION

To overcome the problems described above, preferred embodiments of the invention provide a MEMS element capable of preventing a movable portion and a smooth surface member from being corroded by etching away a sacrificial layer, and also provide a method for manufacturing the MEMS element.

A preferred embodiment of the present invention provides a MEMS element preferably including a substrate, a fixed portion fixed to the substrate, a movable portion provided with a space between the movable portion and the substrate, and a support beam which connects the movable portion to the fixed portion. The fixed portion, the movable portion, and the support beam are formed using a metal layer that is laminated on the substrate with a first sacrificial layer provided therebetween, and then the first sacrificial layer is entirely etched away by a wet etching method, and a second sacrificial layer is arranged on the substrate so as to be electrically connected to the movable portion, the second sacrificial layer having a higher ionization tendency than that of the movable portion and being preferentially etched away as compared to the movable potion so that the second sacrificial layer partially remains when the first sacrificial layer is entirely etched away.

The movable portion and the substrate are provided with a space therebetween, and thus, the movable portion can be displaced by, for example, an external inertial force or by electrostatic force, thereby permitting the formation of an acceleration sensor, an angular velocity sensor, or a variable-capacitance element. In addition, in manufacturing the MEMS element, the first sacrificial layer is previously provided between the substrate and the movable portion, and a space can be formed between the movable portion and the substrate by entirely etching away the first sacrificial layer. In this case, the second sacrificial layer having a higher ionization tendency than that of the movable portion is preferably arranged on the substrate so as to be electrically connected to the movable portion. Therefore, when the first sacrificial layer is removed by the wet etching method, the second sacrificial layer is preferentially etched away as compared to the movable portion. Therefore, even when an etchant that corrodes the movable portion is used, corrosion of the movable portion can be effectively prevented by partially leaving the second sacrificial layer, and thus, the surface of the movable portion can be maintained in a smooth state. As a result, a displacement of the movable portion can be detected with high precision by, for example, using a capacitance between the movable portion and a fixed electrode provided on the substrate Another preferred embodiment of the present invention preferably includes a substrate, a smooth surface member provided on the substrate and including a smooth surface, and a structure arranged on the substrate to be in contact with a first sacrificial layer, wherein the first sacrificial layer is entirely etched away by a wet etching method using an etchant that corrodes the smooth surface member, and a second sacrificial layer is arranged on the substrate so as to be electrically connected to the smooth surface member, the second sacrificial layer having a higher ionization tendency than that of the smooth surface member and being preferentially etched away as compared to the smooth surface member so that the second sacrificial layer partially remains when the first sacrificial layer is entirely etched away.

The smooth surface member including a smooth surface is provided on the substrate, and thus, for example, a cover or other similar structure can be securely compression-bonded to the surface of the smooth surface member. In addition, in manufacturing the MEMS element, the structure is arranged on the substrate so as to be in contact with the first sacrificial layer, and thus, the structure can be formed by entirely etching away the first sacrificial layer. In this case, the second sacrificial layer having a higher ionization tendency than that of the smooth surface member is preferably arranged on the substrate to be electrically connected to the smooth surface member. Therefore, when the first sacrificial layer is removed by the wet etching method, the second sacrificial layer is preferentially etched away as compared to the smooth surface member. Therefore, even when an etchant that corrodes the smooth surface member is used, corrosion of the smooth surface member can be effectively prevented by partially leaving the second sacrificial layer, and thus, the surface of the smooth surface member can be maintained in a smooth state.

According to another preferred embodiment of the present invention, a cover is preferably arranged on the smooth surface member so as to cover the structure.

The cover is arranged on the smooth surface member so as to cover the structure, and thus, a receiving space can be defined between the substrate and the cover so that the structure is disposed in the receiving space. In addition, when the first sacrificial layer is removed by the wet etching method, corrosion of the smooth surface member can be prevented by partially leaving the second sacrificial layer. As a result, the surface of the smooth surface member can be maintained in a smooth state, and thus, for example, the smooth surface member and the cover can be securely pressure-bonded together.

Another preferred embodiment of the present invention provides a MEMS element preferably including a substrate, a structure in which a fixed portion fixed to the substrate and a movable portion provided with a space between the movable portion and the substrate are connected to each other through a support beam, and a smooth surface member including a smooth surface and provided on the substrate at a position different from the structure, wherein the structure is formed using a metal layer laminated on the substrate with a first sacrificial layer provided therebetween, and then the first sacrificial layer is entirely etched away by a wet etching method, and a second sacrificial layer and a third sacrificial layer are preferably arranged on the substrate so that the second sacrificial layer is electrically connected to the structure, and the third sacrificial layer is electrically connected to the smooth surface member, the second sacrificial layer having a higher ionization tendency than the structure and being preferentially etched away as compared to the structure and the third sacrificial layer having a higher ionization tendency than the smooth surface member and being preferentially etched away as compared to the smooth surface member so that each of the second and the third sacrificial layers partially remains after the first sacrificial layer is entirely etched away.

According to this preferred embodiment of the present invention, the structure including the movable portion is provided on the substrate, and thus, an acceleration sensor or other suitable device can be formed using the structure. In addition, the smooth surface member is provided on the substrate, and thus, for example, a cover or other suitable structure can be securely pressure-bonded to the surface of the smooth surface member.

Also, in manufacturing the MEMS element, the first sacrificial layer is previously provided between the substrate and the movable portion, and a space can be formed between the movable portion and the substrate by entirely etching away the first sacrificial layer. In this case, the second sacrificial layer having a higher ionization tendency than that of the structure is arranged on the substrate so as to be electrically connected to the structure. In addition, the third sacrificial layer having a higher ionization tendency than that of the smooth surface member is arranged on the surface of the substrate so as to be electrically connected to the smooth surface member. Therefore, when the first sacrificial layer is removed by the wet etching method, the second sacrificial layer is preferentially etched away as compared to the structure, and the third sacrificial layer is preferentially etched away preferentially over the smooth surface member.

Therefore, even when an etchant that corrodes the smooth surface member is used, corrosion of the structure and the smooth surface member can be effectively prevented by partially leaving the second and third sacrificial layers, respectively, and thus, the structure and the smooth surface member can be maintained in a smooth state. As a result, a displacement of the movable portion can be detected with high precision by, for example, using a capacitance between the movable portion and a fixed electrode provided on the substrate, and a cover can be securely pressure-bonded to the smooth surface member.

Another preferred embodiment of the present invention provides a method for manufacturing a MEMS element including a substrate, a fixed portion fixed to the substrate, a movable portion provided with a space between the movable member and the substrate, and a support beam which connects the movable portion to the fixed portion, the method preferably including a step of providing on the substrate, a first sacrificial layer at a position corresponding to the movable portion and the support beam and a second sacrificial layer having a higher ionization tendency than that of the movable portion and being preferentially etched away as compared to the movable portion, a step of forming a plating electrode layer to cover at least the first sacrificial layer and the second sacrificial layer, forming a resist pattern having an opening on the surface of the plating electrode layer, electroplating the opening of the resist pattern using the plating electrode layer, removing the resist pattern and partially removing the plating electrode layer to form the fixed portion, the movable portion, and the support beam, and electrically connecting the movable portion to the second sacrificial layer by using a remaining portion of the plating electrode layer, and a step of entirely etching away the first sacrificial layer and etching away the second sacrificial layer to leave a portion thereof by a wet etching method with an etchant that corrodes the movable portion.

According to this preferred embodiment of the present invention, the plating electrode layer is formed to cover the first and second sacrificial layers, and thus, the fixed portion, the movable portion, and the support beam can be formed by electroplating with the plating electrode layer and then partially removing the plating electrode layer. Also, the movable portion can be electrically connected to the second sacrificial layer using the remaining portion of the plating electrode layer. Further, a space can be formed between the substrate and the movable portion and between the substrate and the movable portion by entirely etching away the first sacrificial layer by the wet etching method. Further, the first sacrificial layer is removed to leave a portion of the second sacrificial layer, and thus, the second sacrificial layer is preferentially etched away as compared to the movable portion. Therefore, when an etchant that corrodes the movable portion is used, corrosion of the movable portion can be effectively prevented, and thus, the surface of the movable portion can be maintained in a smooth state. As a result, a displacement of the movable portion can be detected with high precision by, for example, using a capacitance between the movable portion and a fixed electrode provided on the substrate.

Another preferred embodiment of the present invention provides a method for manufacturing a MEMS element including a substrate, a fixed portion fixed to the substrate, a movable portion provided with a space between the movable portion and the substrate, and a support beam which connects the movable portion to the fixed portion, the method preferably including a step of providing, on the substrate, a first sacrificial layer at a position, which corresponds to the movable portion and the support beam, and a second sacrificial layer having a higher ionization tendency than that of the movable portion and being preferentially etched away as compared to the movable portion, a step of forming a first metal layer to cover the first sacrificial layer and forming a second metal layer which electrically connects the second sacrificial layer to a region formed from the first metal layer and corresponding to the movable portion, a step of forming the fixed portion, the movable portion, and the support beam using the first metal layer, and a step of entirely etching away the first sacrificial layer and etching away the second sacrificial layer to leave a portion thereof by a wet etching method with an etchant that corrodes the movable portion.

According to this preferred embodiment of the present invention, the first metal layer is preferably formed to cover the first sacrificial layer, and thus, the fixed portion, the movable portion, and the support beam can be formed by using the first metal layer. Also, a space can be formed between the movable portion and the substrate by entirely etching away the first sacrificial layer by the wet etching method. Further, the second sacrificial layer is electrically connected to the movable portion, and thus, when the first sacrificial layer is removed, the second sacrificial layer is preferentially etched away as compared to the movable portion. Therefore, when an etchant that corrodes the movable portion is used, corrosion of the movable portion can be effectively prevented by leaving a portion the second sacrificial layer, and thus, the surface of the movable portion can be maintained in a smooth state. As a result, a displacement of the movable portion can be detected with high precision by, for example, using capacitance between the movable portion and a fixed electrode provided on the substrate.

Another preferred embodiment of the present invention provides a method for manufacturing a MEMS element including a substrate, a fixed portion fixed to the substrate, a movable portion provided with a space between the movable portion and the substrate, and a support beam which connects the movable portion to the fixed portion, the method preferably including a step of providing, on the substrate, a first sacrificial layer at a position, which corresponds to the movable portion and the support beam, and a second sacrificial layer having a higher ionization tendency than that of the movable portion and being preferentially etched away as compared to the movable portion, a step of forming a resist pattern including an opening to cover at least the first sacrificial layer and the second sacrificial layer, depositing a metal on the surface of the resist pattern to form the movable portion, the fixed portion, and the support beam and form a metal layer which electrically connects the movable portion to the second sacrificial layer, and removing the resist pattern; and a step of entirely etching away the first sacrificial layer and etching away the second sacrificial layer to leave a portion thereof by a wet etching method with an etchant that corrodes the movable portion.

According to this preferred embodiment of the present invention, the resist pattern including an opening is formed to cover at least the first sacrificial layer and the second sacrificial layer, and thus, the fixed portion, the movable portion, and the support beam can be formed by depositing a metal on the surface of the resist pattern. Also, a space can be formed between the substrate and the movable portion and between the substrate and the support beam by entirely etching away the first sacrificial layer by the wet etching method. On the other hand, the second sacrificial layer is electrically connected to the movable portion using the laminated metal layer, and thus, when the first sacrificial layer is removed, the second sacrificial layer is preferentially etched away as compared to the movable portion. Therefore, even when an etchant that corrodes the movable portion is used, corrosion of the movable portion can be effectively prevented by leaving a portion of the second sacrificial layer, and thus, the surface of the movable portion can be maintained in a smooth state. As a result, a displacement of the movable portion can be detected with high precision by, for example, using a capacitance between the movable portion and a fixed electrode provided on the substrate.

Another preferred embodiment of the present invention provides a method for manufacturing a MEMS element including a substrate, a structure provided on the substrate, and a smooth surface member provided on the substrate and including a smooth surface, the method preferably including a step of providing, on the substrate, a first sacrificial layer and a second sacrificial layer having a higher ionization tendency than that of the smooth surface member and being preferentially etched away as compared to the smooth surface member, a step of forming a plating electrode layer to cover at least the first sacrificial layer and the second sacrificial layer, forming a resist pattern including an opening on the surface of the plating electrode layer, electroplating the opening of the resist pattern using the plating electrode layer, removing the resist pattern and removing a portion of the plating electrode layer to form the structure and the smooth surface member, and electrically connecting the smooth surface member to the second sacrificial layer using a remaining portion of the plating electrode layer; and a step of entirely etching away the first sacrificial layer and etching away the second sacrificial layer to leave a portion thereof by a wet etching method with an etchant which corrodes the smooth surface member.

According to this preferred embodiment of the present invention, the plating electrode layer is formed to cover the first sacrificial layer and the second sacrificial layer, and thus the structure and the smooth surface member can be formed by electroplating using the plating electrode layer and then partially removing the plating electrode layer. Also, the smooth surface member can be electrically connected to the second sacrificial layer using the remaining portion of the plating electrode layer. Therefore, when the first sacrificial layer is entirely etched away by the wet etching method using an etchant that corrodes the smooth surface member, the second sacrificial layer is preferentially etched away as compared to the smooth surface member. Thus, corrosion of the smooth surface member can be securely prevented by leaving a portion of the second sacrificial layer, and thus, the surface of the smooth surface member can be maintained in a smooth state. As a result, for example, even when a cover or other suitable structure is pressure-bonded to the smooth surface member, the cover can be securely pressure-bonded to the smooth surface member.

Another preferred embodiment of the present invention provides a method for manufacturing a MEMS element including a substrate, a structure in which a fixed portion fixed to the substrate and a movable portion provided with a space between the movable portion and the substrate are connected to each other with a support beam, and a smooth surface member including a smooth surface and provided on the substrate at a position different from the structure, the method including a step of providing, on the substrate, a first sacrificial layer at a position which corresponds to the movable portion and the support beam, a second sacrificial layer having a higher ionization tendency than that of the structure and being preferentially etched away as compared to the structure, and a third sacrificial layer having a higher ionization tendency than that of the smooth surface member and being preferentially etched away as compared to the smooth surface member, a step of forming a plating electrode layer to cover at least the first sacrificial layer, the second sacrificial layer, and the third sacrificial layer, forming a resist pattern having an opening on the surface of the plating electrode layer, electroplating the opening of the resist pattern using the plating electrode layer, removing the resist pattern and removing a portion of the plating electrode layer to form the structure and the smooth surface member, and electrically connecting the structure to the second sacrificial layer and electrically connecting the smooth surface member to the third sacrificial layer using a remaining portion of the plating electrode layer, and a step of entirely etching away the first sacrificial layer and etching away the second and third sacrificial layers to leave portions thereof by a wet etching method with an etchant that corrodes the structure and the smooth surface member.

According to this preferred embodiment of the present invention, the plating electrode layer is formed to cover the first to third sacrificial layers, and thus, the structure and the smooth surface member can be formed by electroplating using the plating electrode layer and then partially removing the plating electrode layer. Also, by using the remaining portion of the plating electrode layer, the structure can be electrically connected to the second sacrificial layer, and the smooth surface member can be electrically connected to the third sacrificial layer. In addition, a space can be formed between the substrate and the movable portion and between the substrate and the support beam by entirely etching away the first sacrificial layer by the wet etching method. Further, when the first sacrificial layer is removed by a wet etching method, the second sacrificial layer is preferentially etched away as compared to the structure, and the third sacrificial layer is preferentially etched away as compared to the smooth surface member. Therefore, even when an etchant that corrodes the smooth surface member is used, corrosion of the structure and the smooth surface member can be effectively prevented by leaving portions of the second and third sacrificial layers, and thus, the structure and the smooth surface member can be maintained in a smooth state.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
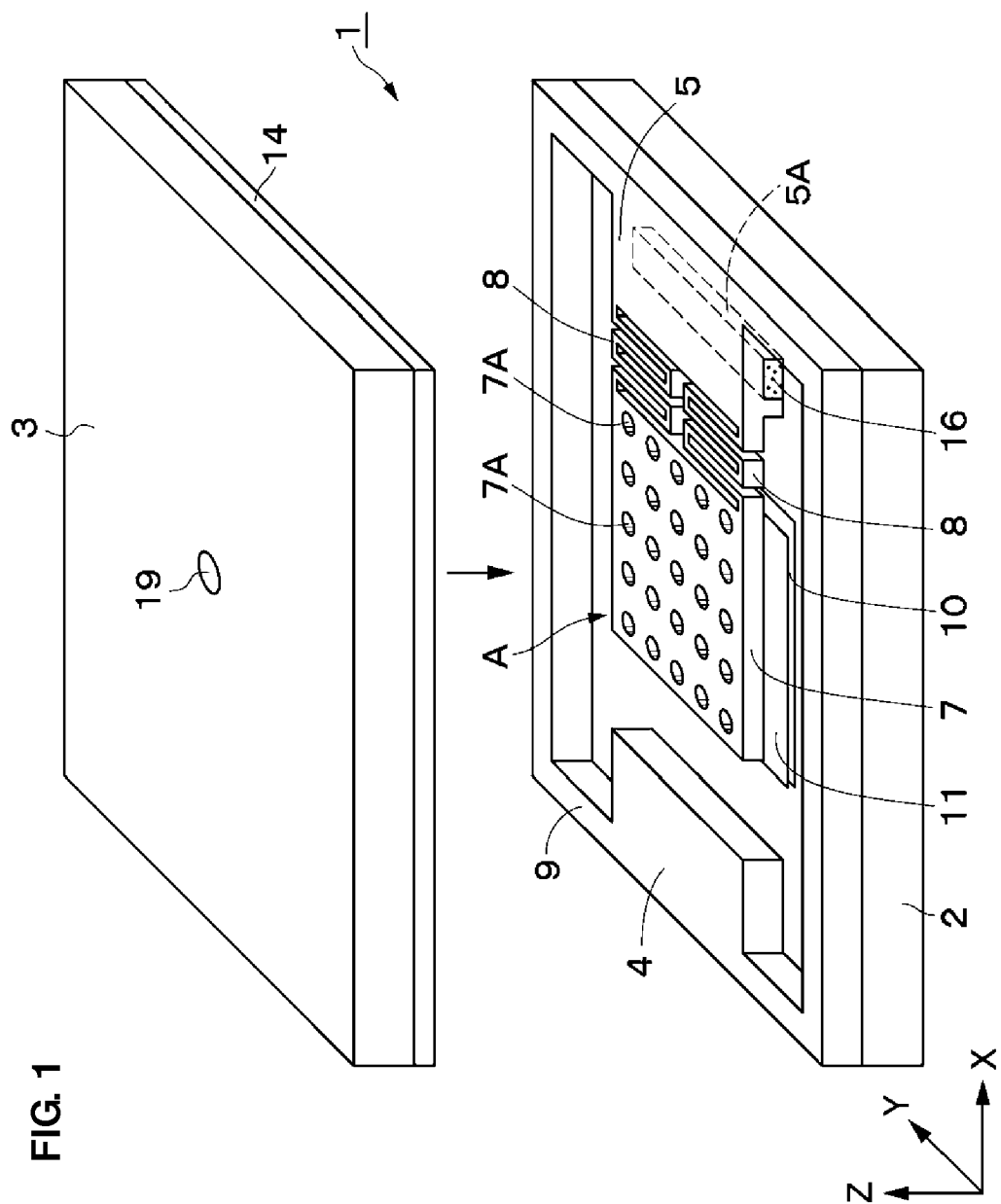
FIG. 1 is an exploded perspective view showing an acceleration sensor according to a first preferred embodiment of the present invention.
Figure 2:
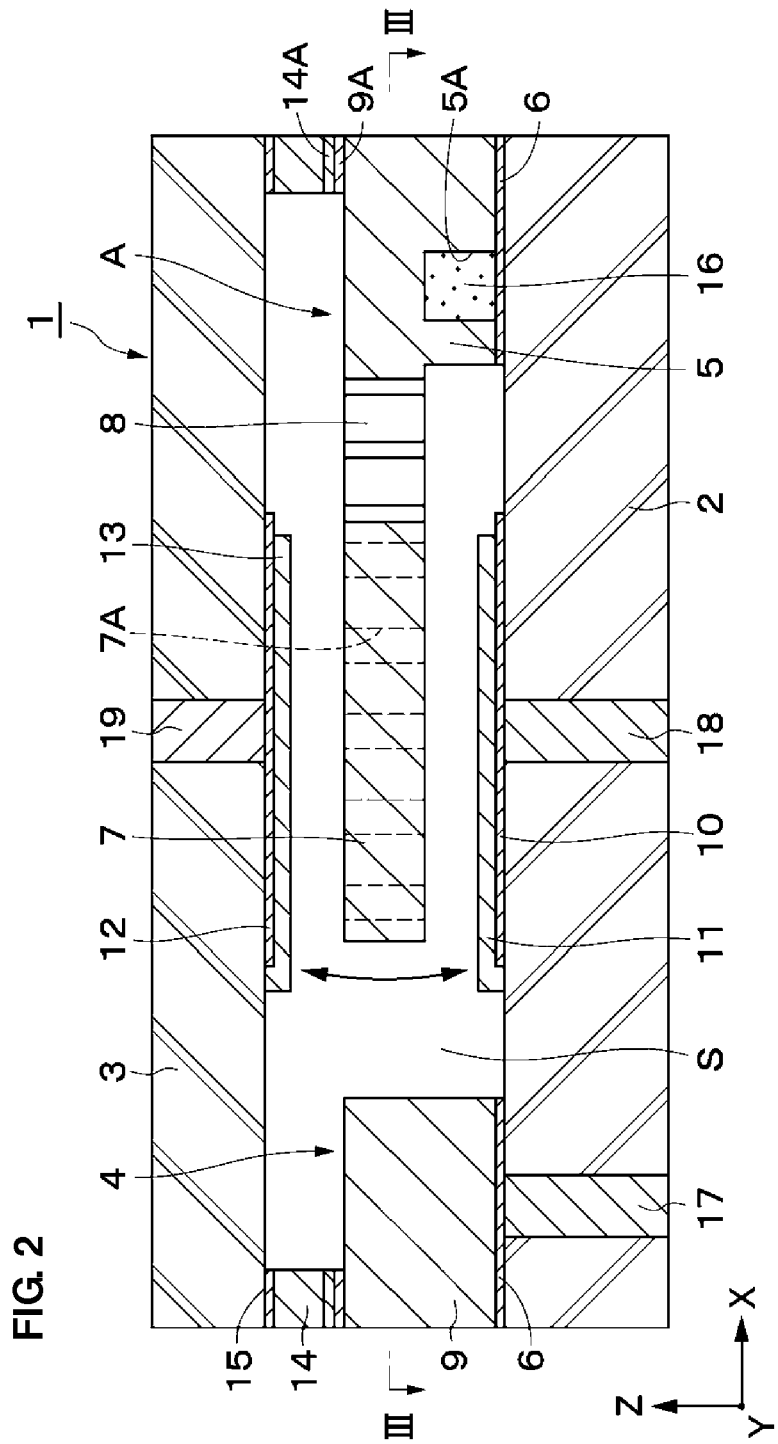
FIG. 2 is a longitudinal sectional view showing the acceleration sensor shown in FIG. 1.
Figure 3:
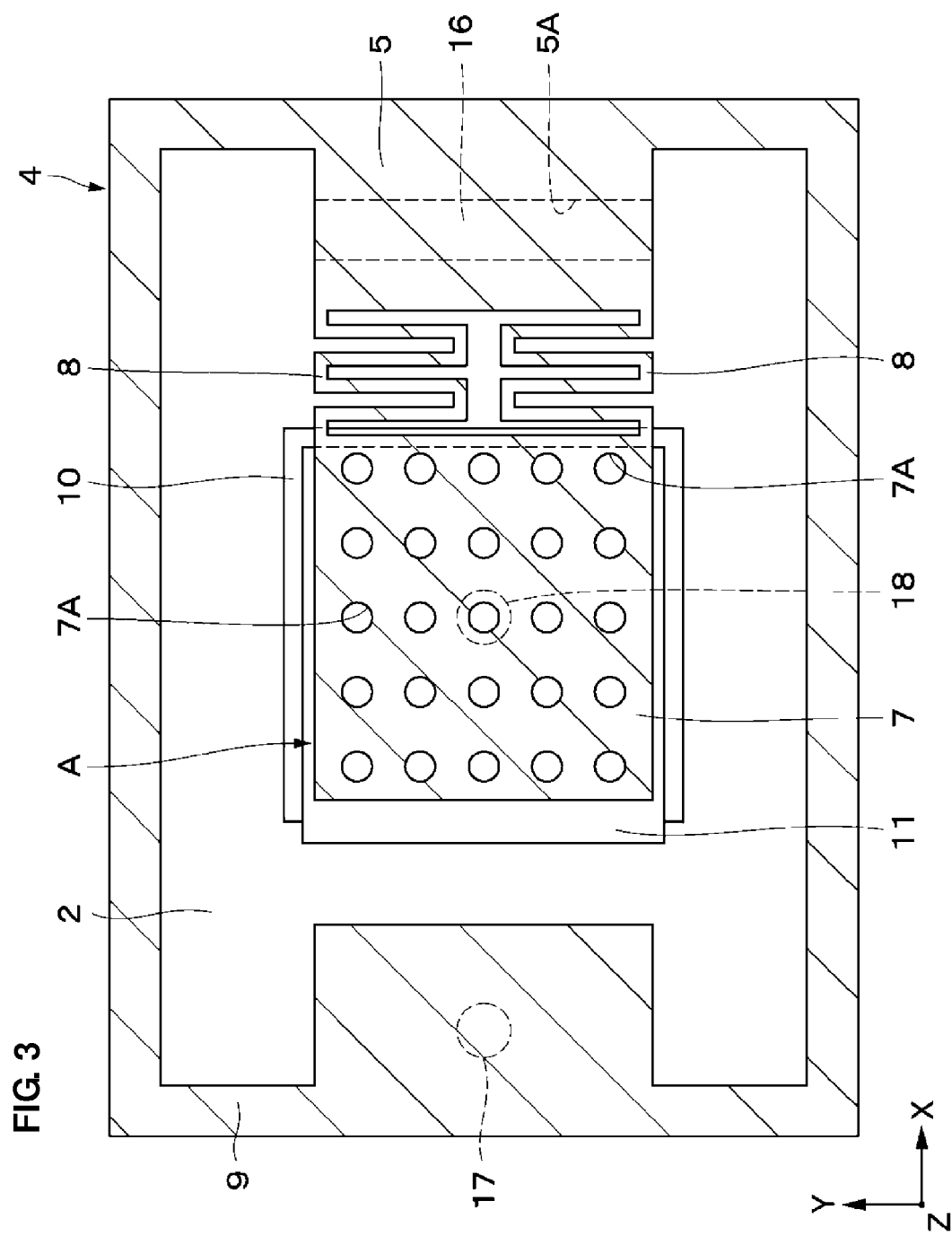
FIG. 3 is a sectional view of the acceleration sensor as viewed from direction III-III shown by arrows in FIG. 2.

A MEMS element according to preferred embodiments of the present invention is described in detail below with reference to the attached drawings.

First, FIGS. 1 to 9 show a first preferred embodiment of the present invention. In the first preferred embodiment, an acceleration sensor is described as an example of a MEMS element.

In the drawings, an acceleration sensor 1 preferably includes first and second substrates 2 and 3, an etched layer 4 sandwiched between the substrates 2 and 3 and formed by etching, and a sealing frame 14 provided between the etched layer 4 and the second substrate 3. Here, the substrates 2 and 3 are preferably composed of, for example, a glass material having insulating properties, and configured in a tetragonal shape with a size of about several millimeters.

In addition, a receiving space S which receives a movable portion 7 described below is defined between the substrates 2 and 3. In this case, the second substrate 3 defines a cover which covers the receiving space S. Assuming that three axis directions perpendicular to each other are an X axis, a Y axis, and a Z axis, the substrates 2 and 3 and the etched layer 4 extend, for example, in a horizontal direction along the X axis and the Y axis.

On the other hand, the etched layer 4 is formed using a metal layer 26 described below which is preferably composed of a conductive metallic material, for example, gold (Au) or copper (Cu). In the etched layer 4, a fixed potion 5, a movable portion 7, support beams 8, and a support frame 9, which are described below, are formed.

The fixed potion 5 is formed in the etched layer 4 and is fixed to the first substrate 2. The fixed portion 5 is disposed, for example, on a side in the X-axis direction and is connected to the support frame 9 described below. In addition, an adhesive layer 6 preferably composed of a conductive metallic material, for example, chromium (Cr) or platinum (Pr), is formed between the substrate 2 and the fixed portion 5 and between the substrate 2 and the support frame 9 in order to enhance adhesion therebetween. Further, the fixed portion 5 includes an elongated receiving groove 5A extending in the Y-axis direction, a remaining sacrificial layer 16 described below being provided in the receiving groove 5A. The fixed portion 5 preferably defines, together with the movable portion 7 and the support beams 8 described below, a functional portion to detect acceleration.

The movable portion 7 is formed in the etched layer 4 and is supported on the fixed portion 5 by the support beams 8 described below. The movable portion 7 is formed using a metal layer 26 as a member to be etched described below and preferably defines, together with the fixed portion 5 and the support beams 8, a structure A. In addition, the structure A is not limited to a configuration including only the functional portion which includes the fixed portion 5, the movable portion 7, and the support beams 8, but may also include various electrodes, wiring, and circuit elements, for example.

The movable portion 7 is disposed on a central side of the substrates 2 and 3 so as to be displaceable in the thickness direction (Z-axis direction). The movable portion 7 preferably has, for example, a tetragonal plate shape having a thickness dimension (for example, several μm) that is less than that of the fixed portion 5. The movable portion 7 faces each of the substrates 2 and 3 with a space therebetween, so as to form a space between the movable portion 7 and each of the substrates 2 and 3. Therefore, the movable portion 7 is displaced in the thickness direction according to an inertial force due to acceleration.

In addition, a plurality of through holes 7A are preferably provided in the movable portion 7 and extend through the movable portion 7 in the thickness direction. The through holes 7A function to promote corrosion of a first sacrificial layer 22 described below when the movable portion 7 is formed by etching. Also, the through holes 7A function to decrease the resistance due to surrounding gas after the acceleration sensor 1 is manufactured.

For example, the two support beams 8 are preferably provided between the movable portion 7 and the fixed portion 5 so as to support the movable portion 7 in a cantilever manner so that the movable portion 7 can be displaced in the vertical direction. Preferably, each of the support beams 8 is defined by, for example, a crank-shaped bent beam and is disposed between the substrates 2 and 3 so as to extend in the horizontal or substantially horizontal direction and are spaced apart from each of the substrates 2 and 3 in the vertical direction (thickness direction).

In addition, the base end of each of the support beams 8 is connected to the fixed portion 5, and the distal end thereof is connected to the movable portion 7. Further, each of the support beams 8 is torsionally or flexurally deformed in the vertical direction at the time of displacement of the movable portion 7 toward the substrate 2 or 3. Further, the support beams 8 preferably have, for example, the same or substantially the same thickness dimension as the movable portion 7. Therefore, the support beams 8 are configured to be easily deformable in the vertical direction.

The support frame 9 is preferably provided in the etched layer 4 and has, for example, a tetragonal frame shape extending along the periphery of the substrates 2 and 3. The support frame 9 surrounds the structure A including the movable portion 7, the support beams 8, other suitable elements. In addition, the support frame 9 preferably has a thickness dimension of about several μm to several tens μm (for example, about 10 μm) and supports, together with the sealing frame 14 described below, the receiving space S between the substrates 2 and 3. The support frame 9 also defines a smooth surface member including a smoothed surface.

A first fixed electrode 10 is provided on the front surface side of the first substrate 2 at a position facing the movable portion 7. The first fixed electrode 10 is preferably made of, for example, the same conductive metal thin film as the adhesive layer 6. In addition, the fixed electrode 10 faces the movable portion 7 over substantially the entire surface and is connected to a first fixed-side extraction electrode 18 described below. Further, the fixed electrode 10 is preferably covered with an insulating film 11 made of, for example, silicon oxide or silicon nitride, in order to prevent contact with the movable portion 7.

A second fixed electrode 12 is provided on the back side of the second substrate 3 at a position facing the movable portion 7. The second fixed electrode 12 is preferably made of, for example, a conductive metal thin film. In addition, the fixed electrode 12 faces the movable portion 7 over substantially the entire surface and is connected to a second fixed-side extraction electrode 19. Further, the fixed electrode 12 is preferably covered with substantially the same insulating film 13 as the insulating film 11.

The sealing frame 14 is disposed between the etched layer 4 and the second substrate 3 and preferably has a substantially tetragonal frame shape, for example, along the periphery of the second substrate 3. Here, similar to the support frame 9, the sealing frame 14 is preferably made of, for example, a conductive metallic material, such as copper. In addition, the same adhesive layer 15 as the adhesive layer 6 is preferably provided between the sealing frame 14 and the substrate 3 using, for example, the same metal thin film as the fixed electrode 12.

Further, the sealing frame 14 preferably includes a bonding film 14A disposed on the surface side facing the support frame 9 and composed of a conductive metallic material, such as a gold (Au) alloy or gold, for example. Similarly, the support frame 9 includes the same or substantially the same bonding film 9A as the bonding film 14A, the bonding film 9A being disposed on the surface side facing the sealing frame 14. These bonding films 9A and 14A are thermocompression-bonded under pressure so that the first and second substrates 2 and 3 are closely and securely adhered to each other. As a result, the sealing frame is bonded to the support frame 9 to define the airtight receiving space S which receives the movable portion 7 between the first and second substrates 2 and 3.

The remaining sacrificial layer 16 is disposed on the first substrate 2 at the position of the fixed portion 5 and is covered with the fixed portion 5. The remaining sacrificial layer 16 is formed by leaving a portion of a second sacrificial layer 23 when a first sacrificial layer 22 described below is etched away. In addition, the adhesive layer 6 is formed between the remaining sacrificial layer 16 and the substrate 2. In this case, the remaining sacrificial layer 16 including the second sacrificial layer 23 is preferably provided using a material, for example, titanium (Ti), nickel (Ni), iron (Fe), chromium (Cr), or aluminum (Al), which has a higher ionization tendency than that of the metallic material of the etched layer 4 including the movable portion 7.

In addition, the remaining sacrificial layer 16 is electrically connected to the structure A including the movable portion 7 and the support frame 9 through, for example, the fixed portion 5 and the adhesive layer 6. The remaining sacrificial layer 16 is disposed in a receiving groove 5A of the fixed portion 5, the receiving groove 5A being in communication with the receiving space S. Therefore, when the first sacrificial layer 22 described below is etched away by the wet etching method to form a space between the movable portion 7 and the first substrate 2, the etching solution enters the receiving groove 5A. Consequently, the remaining sacrificial layer 16 is preferentially etched away as compared to the structure A, which includes the movable portion 7 and other elements, and the support frame 9.

A movable-side extraction electrode 17 is disposed, for example, at a position corresponding to the support frame 9 in the first substrate 2, and is electrically connected to the movable portion 7 through the fixed portion 5 and the support beams 8. The movable-side extraction electrode 17 is preferably formed by forming a via hole (through hole) for signals, which extends through the substrate 2 in the thickness direction, for example, by a laser processing or micro blasting method, and then filling the through hole with a conductive metallic material, such as copper (Cu), for example.

The first fixed-side extraction electrode 18 is provided on the first substrate 2 to be electrically connected to the first fixed electrode 10. In addition, the second fixed-side extraction electrode 19 is provided on the second substrate 3 to be electrically connected to the second fixed electrode 12. Similar to the movable-side extraction electrode 17, each of the first and second fixed-side extraction electrodes 18 and 19 is preferably formed by filling a through hole, which extends through the substrate 2 or 3, with a conductive metallic material, such as copper (Cu), for example.

The extraction electrodes 17 to 19 are connected to an external detection circuit or other suitable circuit element. The detection circuit detects signals corresponding to a capacitance between the extraction electrodes 17 and 18 and a capacitance between the extraction electrodes 17 and 19 and performs a differential operation of the signals. Since the output of the differential operation changes with a displacement of the movable portion 7, the detection circuit can detect an acceleration acting on the acceleration sensor 1 based on the output of the differential operation.

Next, a method for manufacturing the acceleration sensor 1 according to a preferred embodiment of the present invention is described with reference to FIGS. 4 to 9.

Figure 4:
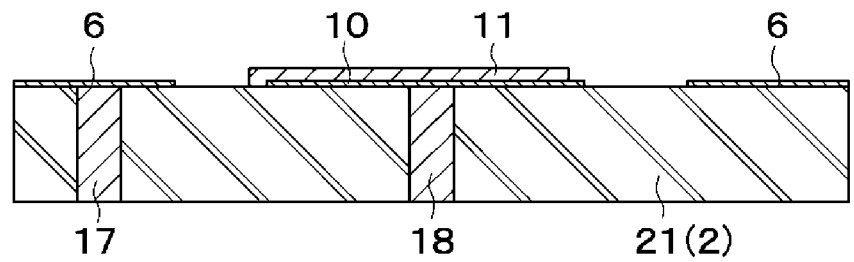
FIG. 4 is a longitudinal sectional view showing a state in which a first fixed electrode and other elements are formed on a glass substrate in a first substrate forming step.

First, in a first substrate forming step shown in FIG. 4, an insulating glass substrate 21 used as the first substrate 2 of the acceleration sensor 1 is prepared. Then, through holes are formed in the glass substrate 21 by a laser processing or micro blasting method, for example, and the through holes are filled with a conductive metallic material, such as copper, for example, by plating to form the movable-side extraction electrode 17 and the fixed-side extraction electrode 18.

In addition, a conductive metal thin film is formed on the glass substrate 21 by, for example, a sputtering or vapor deposition method. By using this metal thin film, on the surface of the glass substrate 21, the fixed electrode 10 is formed at a position corresponding to the movable portion 7, and the adhesive layer 6 is formed at positions corresponding to the fixed portion 5 and the support frame 9. In this step, the adhesive layer 6 and the fixed electrode 10 are connected to the extraction electrodes 17 and 18, respectively. Then, an insulating film 11 is formed on the surface of the fixed electrode 10. The first substrate 2 including the fixed electrode 10 and other elements is preferably formed through the above-described process.

Figure 5:
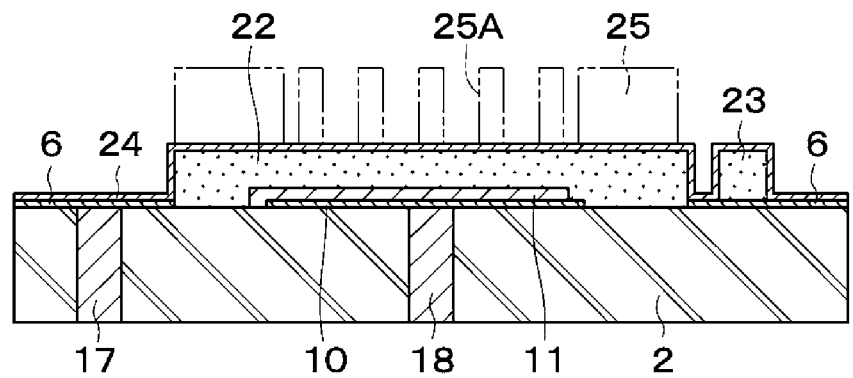
FIG. 5 is a longitudinal sectional view showing a state in which first and second sacrificial layers, and other elements are formed on a first substrate in a sacrificial layer forming step.

Next, in a sacrificial layer forming step shown in FIG. 5, the first sacrificial layer 22 preferably composed of, for example, titanium (Ti), is formed on the surface of the substrate 2 at positions corresponding to the movable portion 7 and the support beams 8. In addition, the second sacrificial layer 23 preferably composed of, for example, the same material as the first sacrificial layer 22 is formed at a position different from the first sacrificial layer 22 and corresponding to the receiving groove 5A in the fixed portion 5. In this step, the first and second sacrificial layers 22 and 23 are formed by a material having a higher ionization tendency than those of the structure A, which includes the movable portion 7 and other elements, and the support frame 9, so that the first and second sacrificial layers 22 and 23 are preferentially etched away as compared to the movable portion 7 and other elements.

The surface of the first sacrificial layer 22 is preferably smoothed by polishing or other suitable method. Consequently, when the first sacrificial layer 22 is removed in a sacrificial layer removing step described below, the back surface of the movable portion 7 that faces the fixed electrode 10 is smoothed.

Next, in a seed layer forming step, a seed layer 24 is formed as a plating electrode layer over the entire or substantially the entire surface of the substrate 2 so as to cover the first and second sacrificial layers 22 and 23 by using, for example, the same conductive metallic material (for example, copper) as the movable portion 7. In this step, the seed layer 24 is preferably formed of, for example, a metal thin film having a thickness of about 0.1 μm or less and provides a basic portion for plating. The seed layer 24 need not necessarily cover the entire surface of the substrate 2 and may be formed to cover at least the surfaces of the first and second sacrificial layers 22 and 23 in an area corresponding to the movable portion 7 and other elements, in order to form the movable portion 7 and other elements on the surfaces of the first and second sacrificial layers 22 and 23, without covering the other areas.

Next, in a plating mold forming step, as shown by two-dot chain lines in FIG. 5, a resist pattern 25 is formed on the surface of the seed layer 24, the resist pattern 25 having openings 25A extending in the thickness direction at positions corresponding to the fixed portion 5, the movable portion 7, and the support beams 8. In this step, the resist pattern 25 is formed by applying a mold material (for example, a photoresist material) which defines a plating mold and prevents growth of the plating and then performing predetermined patterning. In addition, the resist pattern 25 preferably has a thickness dimension (for example, about 15 μm to about 30 μm) greater than the thickness dimension (for example, about 10 μm) of the fixed portion 5.

Figure 6:
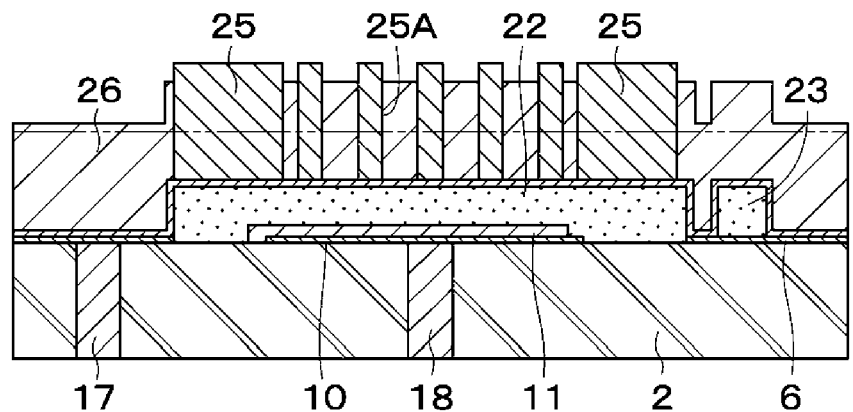
FIG. 6 is a longitudinal sectional view showing a state in which a metal layer is formed to cover first and second sacrificial layers in a plating step.

Next, in a metal layer forming step shown in FIG. 6, a metal layer 26 (plating layer) preferably composed of a conductive metallic material, such as copper, for example, is grown, as a member to be etched, by electroplating using the seed layer 24. As a result, the metal layer 26 is laminated on the surface of the substrate 2 through the first and second sacrificial layers 22 and 23 so as to be disposed in the openings 25A of the resist pattern 25 and to be in contact with the first and second sacrificial layers 22 and 23. In the metal layer 26, a portion which covers the first sacrificial layer 22 and corresponds to the structure A defines a first metal layer. In addition, in the metal layer 26, a portion which covers the second sacrificial layer 23 defines a second metal layer.

When the metal layer 26 is grown beyond the thickness dimension of the fixed portion 5, plating is terminated, and the resist pattern 25 is removed. As a result, in the seed layer 24, an area disposed on the back side (lower side) of the resist pattern 25 and between the resist pattern 25 and the first sacrificial layer 22 is exposed. Therefore, the exposed area of the seed layer 24 is removed using dilute hydrofluoric acid (HF) or other suitable material.

Figure 7:
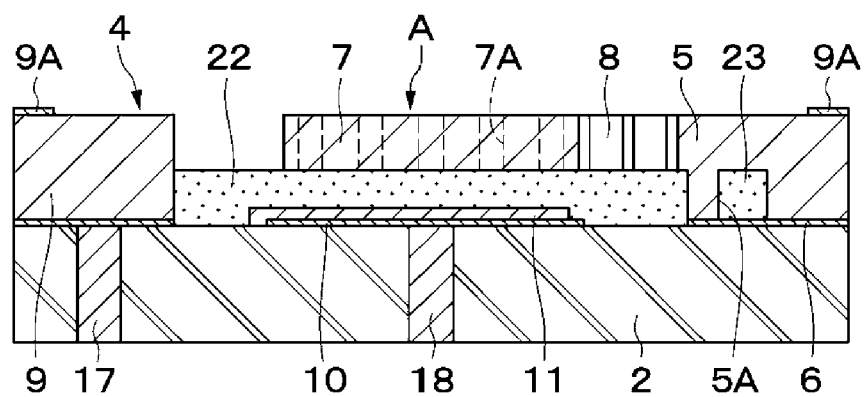
FIG. 7 is a longitudinal sectional view showing a state in which a surface of a metal layer is smoothed to form an etched layer including a fixed portion, a movable portion, a support beam, and other elements in a surface smoothing step.

Next, in a surface smoothing step shown in FIG. 7, the surface of the metal layer 26 is polished to a smooth state up to a position shown by a two-dot chain line in FIG. 6 by using, for example, a CMP (Chemical Mechanical Polishing) method. This polishing forms the etched layer 4 including the fixed portion 5, the movable portion 7, the support beams 8, and the support frame 9, which have smoothed surfaces. At this time, the remaining seed layer 24 is integrated with the etched layer 4. In addition, the second sacrificial layer 23 is electrically connected to the movable portion 7 and the support frame 9 through the fixed portion 5 and the adhesive layer 6.

Next, in a bonding film forming step, for example, a metal thin film of gold (Au) is formed on the surface of the support frame 9 by using, for example, a vapor deposition method or a sputtering method to form the bonding film 9A preferably having a thickness dimension of about 0.3 μm to about 0.7 μm. In addition, an adhesive layer of, for example, chromium (Cr) or platinum (Pt), is preferably provided between the metal thin film composed of gold, for example, and defining the bonding film 9A and the etched layer 4 composed of copper, for example, in order to enhance adhesion therebetween.

Figure 8:
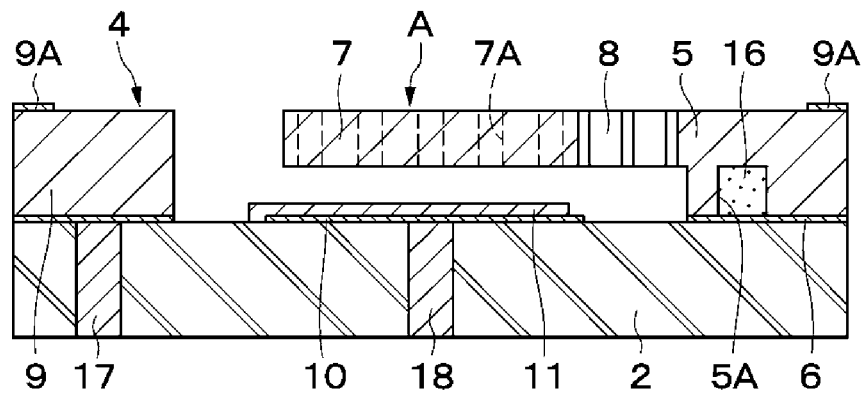
FIG. 8 is a longitudinal sectional view showing a state in which a first sacrificial layer is removed in a sacrificial layer removing step.

Next, in a sacrificial layer removing step shown in FIG. 8, the first sacrificial layer 22 is entirely etched away by the wet etching method using an etching solution, for example, hydrofluoric acid (HF) diluted to 1/50. At the same time, the second sacrificial layer 23 is also etched away. However, since a plurality of through holes 7A are formed in the movable portion 7, the first sacrificial layer 22 is soaked with the etching solution with a greater contact area. In contrast, the second sacrificial layer 23 contacts the etchant only at both ends portions of the receiving groove 5A. Therefore, the first sacrificial layer 22 is removed earlier than the second sacrificial layer 23. Thus, etching is terminated in a state in which the second sacrificial layer 23 partially remains after the first sacrificial layer 22 is entirely etched away. This creates a state in which the movable portion 7 and the support beams 8 face the substrate 2 with a space therebetween and float above the substrate 2.

On the other hand, in a second substrate forming step, an insulating glass substrate 27 is prepared as the substrate 3 of the acceleration sensor 1, and the second fixed-side extraction electrode 19 including a through hole extending through in the thickness direction is formed in the glass substrate 27. In addition, similar to the first substrate forming step, the second fixed electrode 12, the adhesive layer 15, and the insulating film 13 are preferably formed on the rear side of the glass substrate 27. In this step, the second fixed electrode 12 is connected to the extraction electrode 19.

Next, a conductive metal thin film preferably of gold, for example, is formed on the glass substrate 27 by, for example, a sputtering or vapor deposition method. By using this conductive metal thin film, the sealing frame 14 is formed on the rear side of the glass substrate 27 at a position corresponding to the support frame 9. Then, the bonding film 14A is formed on the rear side of the sealing frame 14. The second substrate 3 including the fixed electrode 12 and other elements are preferably formed through the above-described steps (refer to FIG. 9).

Figure 9:
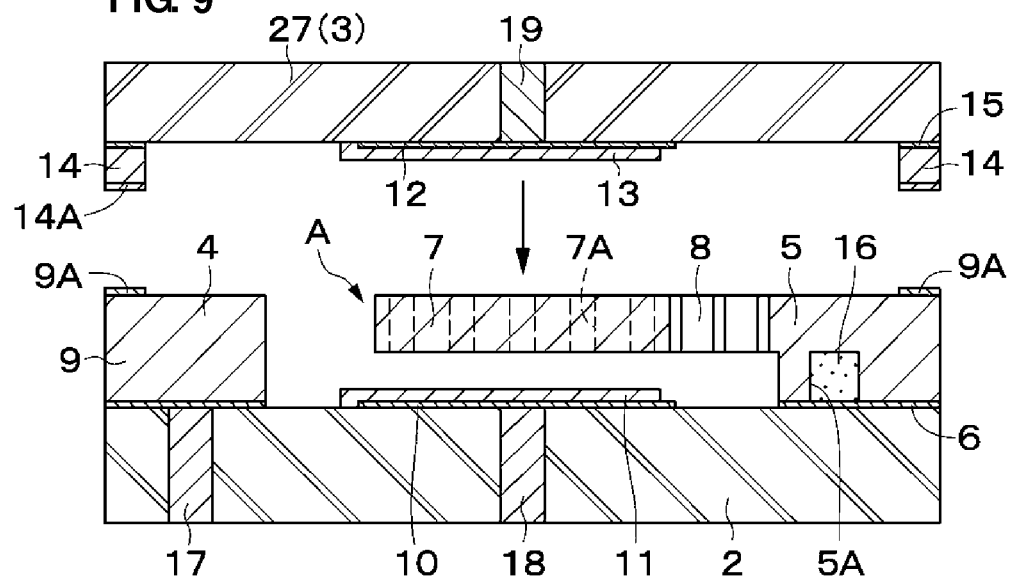
FIG. 9 is a longitudinal sectional view showing a state in which a sealing frame of a second substrate is pressure-bonded to a support frame of an etched layer in a pressure bonding step.
Figure 10:
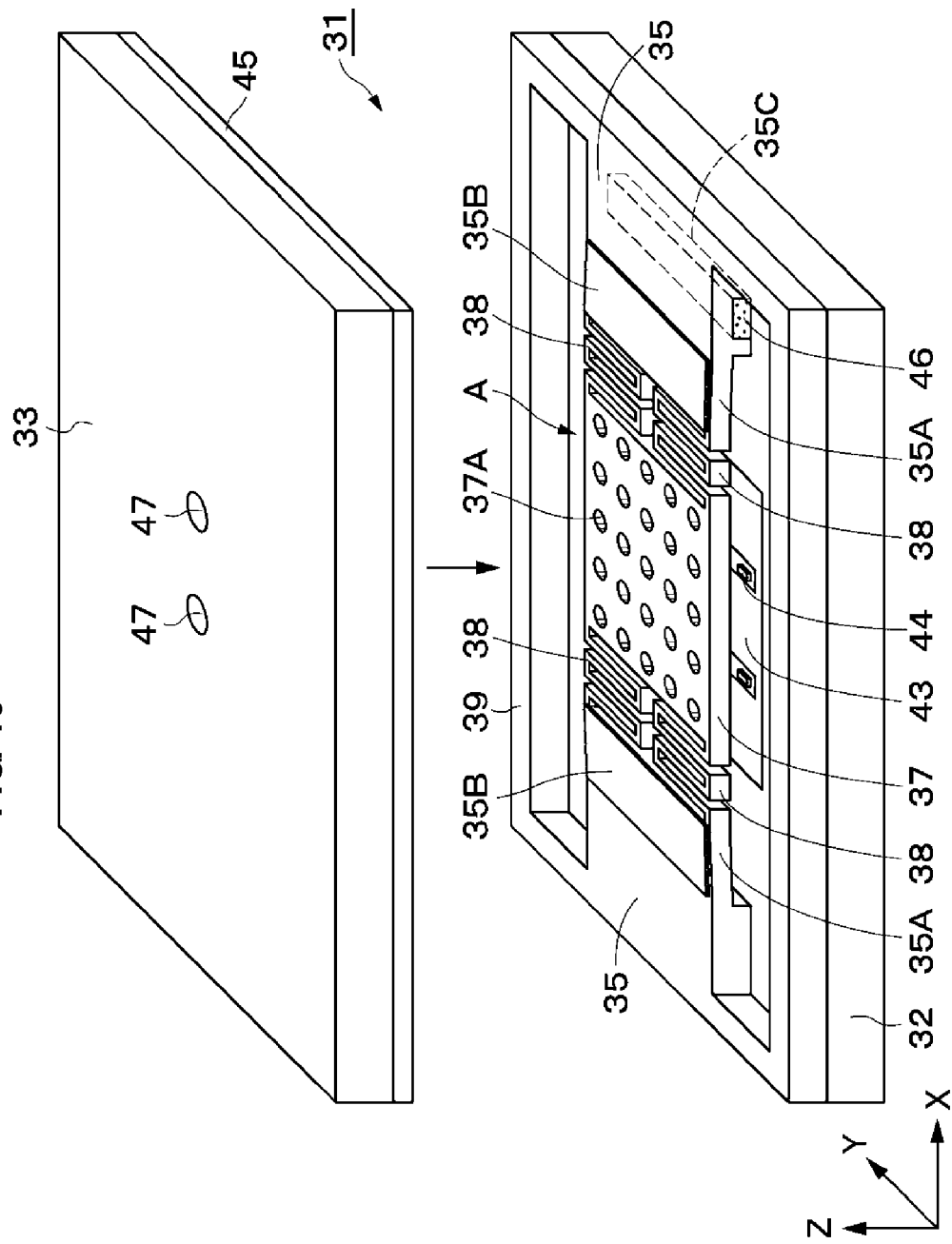
FIG. 10 is an exploded perspective view showing a switching element according to a second preferred embodiment of the present invention.

Next, in a pressure bonding step shown in FIG. 9, the sealing frame 14 of the second substrate 3 is thermocompression-bonded to the support frame 9 of the etched layer 4. Specifically, the support frame 9 and the sealing frame 14 are preferably heated to a predetermined temperature, for example, within a range from about 200° C. to about 400° C. and, at the same time, a predetermined load (for example, a load of about 4 t for a 4-inch wafer) is applied so that the support frame 9 and the sealing frame 14 closely and securely adhere to each other. Consequently, the bonding films 9A and 14A of the support frame 9 and the sealing frame 14, respectively, are pressure-bonded to each other, and the second substrate 3 and the etched layer 4 are bonded and fixed to each other. As a result, the airtight receiving space S is defined between the first and second substrates 2 and 3, and the movable portion 7 is disposed in the receiving space S. In addition, the movable portion 7 is disposed at a position facing the fixed electrodes 10 and 12 of the substrates 2 and 3, respectively, so as to be displaceable in the thickness direction, thereby completing the acceleration sensor 1.

The acceleration sensor 1 according to this preferred embodiment is manufactured by the above-described manufacturing method, and next the operation thereof is described.

First, when an acceleration acts on the acceleration sensor 1, the movable portion 7 is displaced in the thickness direction of the substrates 2 and 3 by an inertial force. At the same time, the capacitance between the movable portion 7 and each of the first and second fixed electrodes 10 and 12 is increased or decreased. In addition, an increase or decrease in capacitance between the movable portion 7 and the first fixed electrode 10 is reverse to that between the movable portion 7 and the second fixed electrode 12. Therefore, the external detector detects a signal corresponding to the capacitance between the movable portion 7 and the first fixed electrode 10 using the extraction electrodes 17 and 18 and detects a signal corresponding to the capacitance between the movable portion 7 and the second fixed electrode 12 using the extraction electrodes 17 and 19. Then, the acceleration acting on the acceleration sensor 1 is detected by a differential operation of the two signals.

Thus, according to this preferred embodiment, when manufacturing the acceleration sensor 1, the first sacrificial layer 22 is provided between the substrate 2 and the movable portion 7, and then the first sacrificial layer 22 is entirely etched away to form a space between the movable portion 7 and the substrate 2. In this case, the second sacrificial layer 23 which has a higher ionization tendency than that of the movable portion 7 and which is covered with the fixed portion 5 is preferably formed on the surface of the substrate 2. Therefore, when the first sacrificial layer 22 is removed by the wet etching method, the second sacrificial layer 23 is preferentially etched away as compared to the movable portion 7. This securely prevents corrosion of the movable portion 7 by leaving, as the remaining sacrificial layer 16, a portion of the second sacrificial layer 23 even with the use of an etchant that corrodes the movable portion 7, thereby maintaining the surface of the movable portion 7 in a smooth state. Therefore, the capacitance between the movable portion 7 and each of the fixed electrodes 10 and 12 does not vary with surface irregularity of the movable portion 7. As a result, a displacement of the movable portion 7 can be detected with high precision by using the capacitance between the movable portion 7 and each of the fixed electrodes 10 and 12 provided on the substrate 2 and 3, respectively.

In addition, the first substrate 2 is preferably configured to be provided with the support frame 9 as a smooth surface member which is electrically connected to the second sacrificial layer 23. Therefore, for example, when the support frame 9 is formed using a material having a lower ionization tendency than the second sacrificial layer 23, such as the same material as the movable portion 7, corrosion of the support frame 9, as well as the movable portion 7, is prevented by the remaining sacrificial layer 16 including the second sacrificial layer 23. Thus, even when the first sacrificial layer 22 is etched away to form the space between the movable portion 7 and the first substrate 2, the surface of the support frame 9 can be maintained in a smooth state.

As a result, the support frame 9 and the sealing frame 14 of the second substrate 3 can be securely pressure-bonded by thermocompression bonding, and defective bonding due to the surface roughness of the support frame 9 is effectively prevented. Thus, the second substrate 3 can be bonded to the support frame 9 and cover the structure A including the movable portion 7 and other elements. Therefore, the receiving space S which receives the structure A can be defined between the first and second substrates 2 and 3 and securely sealed in an airtight condition.

In addition, the first and second substrates 2 and 3 are configured to be provided with the fixed electrodes 10 and 12, respectively, at the position facing the movable portion 7, and thus, the capacitance between the movable portion 7 and each of the fixed electrodes 10 and 12 varies with the displacement of the movable portion 7 in the thickness direction. In this case, the surface of the movable portion 7 is maintained in a smooth state without being corroded by etching, and thus, the capacitance between the movable portion 7 and each of the fixed electrodes 10 and 12 can be set with greater precision.

In addition, in manufacturing the acceleration sensor 1, the metal layer 26 is preferably formed to cover the first and second sacrificial layers 22 and 23, and thus, the movable portion 7 and the support beams 8 can be formed using the metal layer 26. Further, the movable portion 7 and the support beams 8 can be formed so as to be spaced apart from the substrate 2 by the wet etching method to remove the first sacrificial layer 22. Japanese Unexamined Patent Application Publication No. 2004-1186 discloses a MEMS element including a substrate and a driving portion supported in a cantilever manner on the substrate. The MEMS element includes a sacrificial layer which is provided at the base end side of the driving portion and which can be removed by etching. However, in the invention of Japanese Unexamined Patent Application Publication No. 2004-1186, the strong MEMS element is formed by the sacrificial layer on the base end side as the fixed end of the driving portion. Therefore, the spring constant of the driving portion varies according to the amount of the remaining sacrificial layer, thereby easily producing variation between elements.

On the other hand, a preferred embodiment of the present invention is preferably configured such that in manufacturing the acceleration sensor 1, the first sacrificial layer 22 is provided between the substrate 2 and the movable portion 7 and the support beams 8, but the first sacrificial layer 22 is completely etched away. Therefore, the spring constant of the support beams 8 can be maintained substantially constant, thereby preventing variations in characteristics between elements.

Next, FIGS. 10 to 19 show a second preferred embodiment of the present invention. The second preferred embodiment is applied to a switching element preferably including a first substrate provided with a driving electrode which produces an electrostatic attractive force on a movable portion, and a second substrate provided with two signal electrodes so that a high-frequency signal between the signal electrodes is switched.

In FIGS. 10 to 19, a switching element 31 preferably includes first and second substrates 32 and 33, an etched layer 34 formed by etching and sandwiched between the substrates 32 and 33, and a sealing frame 45 provided between the etched layer 34 and the second substrate 33. Here, the substrates 32 and 33 are preferably formed in the same or substantially the same manner as the substrates 2 and 3 of the first preferred embodiment, and a receiving space S is defined between the substrates 32 and 33 to accommodate a movable portion 37 described below. In this case, the second substrate 33 preferably defines a cover which covers the receiving space S.

In addition, the substrates 32 and 33 and the etched layer 34 extend in a horizontal direction, for example, along the X axis and the Y axis. Further, the etched layer 34 is preferably formed using a metal layer 56 described below which is composed of a conductive metallic material, for example, copper (Cu). In addition, fixed portions 35, a movable portion 37, support beams 38, and a support frame 39, which are described below, are provided in the etched layer 34.

The fixed portions 35 are provided in the etched layer 34 so as to be fixed to the first substrate 32. For example, the two fixed portions 35 are provided on the first substrate 32 and are connected to the support frame 39 described below. In addition, the two fixed portions 35 are disposed on both sides of the movable portion 37 so as to hold it therebetween in the X axis direction. Further, an adhesive layer 36 composed of a conductive metallic material, for example, chromium (Cr) or platinum (Pt), is preferably provided between the substrate 32 and the fixed portions 35 connected to the support frame 39 in order to improve adhesion therebetween. In addition, the fixed portions 35 define, together with the movable portion 37 and the support beams 38 described below, a functional portion arranged to switch a high-frequency signal.

Further, a beam connecting portion 35A extending to the central portion of the substrates 32 and 33 is provided on each of the fixed portions 35. The beam connecting portions 35A preferably have, for example, the same or substantially the same thickness dimension as the support beams 38 and are spaced apart from each of the substrates 32 and 33. In addition, an energizing film 35B is preferably provided on the surface of each of the beam connecting portions 35A to generate tensile stress. Thus, the end portion of each of the beam connecting portions 35A is attracted to the second substrate 33, and thus, the beam connecting portions 35A energize the movable portion 37 toward the second substrate 33. On the other hand, an elongated receiving groove 35C is provided in one of the fixed portions 35 to extend in the Y axis direction, and a remaining sacrificial layer 46 described below is preferably provided in the receiving groove 35C.

The movable portion 37 is formed in the etched layer 34 and supported by the fixed portions 35 through the support beams 38 described below. The movable portion 37 is preferably formed using a metal layer 56 that defines a member to be etched described below to define, together with the fixed portions 35 and the support beams 38, the structure A. The structure A is not limited to a configuration that includes only a functional portion which includes the fixed portions 35, the movable portion 37, and the support beams 38, but may also include various electrodes, wiring, a circuit element, and the like, for example.

In addition, the movable portion 37 is preferably formed in substantially the same manner as the movable portion 7 according to the first preferred embodiment so as to face each of the substrates 32 and 33 with a space therebetween and to form a space between the movable portion 37 and each of the substrates 32 and 33. In addition, the movable portion 37 is disposed on the central side of the substrates 32 and 33 so that it can be displaced in the thickness direction (Z axis direction).

Further, the movable portion 37 is displaced in the vertical direction (Z axis direction) by an electrostatic force (electrostatic attraction) generated between the movable portion 37 and a driving electrode 43 described below and approach or separate from the second substrate 33. Therefore, when a voltage is not applied between the movable portion 37 and the driving electrode 43, the movable portion 37 is maintained at a position close to the substrate 33 by the support beams 38 described below.

In addition, the movable portion 37 preferably includes a plurality of through holes 37A extending through the movable portion 37 in the thickness direction. To form the movable portion 37 by etching, these through holes 37A function to promote corrosion of a first sacrificial layer 52 described below. In addition, the through holes 37A also function to decrease the resistance due to surrounding gas after the switching element 31 is manufactured.

The number of the supporting beams 38 provided between the movable portion 37 and each of the two fixed portions 35 is preferably 2, i.e., a total of 4, for example, and the support beams 38 support the movable portion 37 so that the movable portion 37 can be displaced in the vertical direction. Therefore, the four support beams 38 support the movable portion 37 in a doubly supported manner so that the movable portion 37 can be displaced in the vertical direction. In this case, each of the support beams 38 is preferably, for example, a crank-shaped bent beam disposed between the substrates 32 and 33 so as to extend in the horizontal direction and separate from the substrates 32 and 33 in the vertical direction (thickness direction).

In addition, the base end side of each of the support beams 38 is connected to the beam connecting portion 35A of one of the fixed portions 35, and the distal end side is connected to each of the four corners of the movable portion 37. Therefore, the support beams 38 are torsionally or flexurally deformed in the vertical direction at the time of displacement of the movable portion 37 toward the substrate 32. Further, the support beams 38 preferably have, for example, the same thickness dimension as the movable portion 37. Therefore, the support beams 38 are configured to be easily deformable in the vertical direction.

The support frame 39 is formed in the etched layer 34 and formed into, for example, the shape of a tetragonal frame extending along the peripheries of the substrates 32 and 33. The support frame 39 surrounds the structure A including the movable portion 37, the support beams 38, and other elements. In addition, the support frame 39 is formed in substantially the same manner as the support frame 9 according to the first preferred embodiment and provides a receiving space S between the substrates 32 and 33. Further, the support frame 39 preferably defines a smooth surface member having a smoothed surface.

For example, the two signal electrodes 40 are provided on the back side of the second substrate 33 at a position facing the movable portion 37, so as to define fixed electrodes fixed to the second substrate 33. These signal electrodes 40 are preferably formed using the same or substantially the same metallic material (e.g., copper) as a sealing frame 45 described below. In addition, an adhesive layer 41 which is preferably the same or substantially the same as the adhesive layer 36 is provided between the signal electrodes 40 and the substrate 33. On the other hand, a plurality of stoppers 42 preferably composed of an insulating material (for example, silicon oxide, silicon nitride, or other suitable insulating material) are formed on the back sides of the signal electrodes 40 and are disposed between the signal electrodes 40 and the movable portion 37. In this case, the stoppers 42 prevent short-circuiting between the signal electrodes 40 and the movable portion 37.

In addition, the two signal electrodes 40 are preferably arranged in parallel or substantially in parallel along the X axis direction with a space therebetween. Further, the signal electrodes 40 face the movable portion 37 over substantially the entire surface and are connected to signal extraction electrodes 47 described below. In addition, high-frequency signals of about several hundreds of kHz to several tens of GHz, for example, are input to the signal electrodes 40.

In this case, two capacitors (air gap capacitors), which are connected in series through the movable portion 37 are provided between one of the signal electrodes 40 and the movable portion 37 and between the other signal electrode 40 and the movable portion 37. This provides a configuration in which the capacitance of the capacitors, i.e., the capacitance between the two signal electrodes 40, varies according to the distance (distance dimension) between the signal electrodes 40 and the movable portion 37.

The driving electrode 43 is provided on the front surface side of the first substrate 32 and is disposed at a position facing the movable portion 37, so as to define a fixed electrode fixed to the first substrate 32. The driving electrode 43 is preferably made of, for example, a conductive metal thin film, and is disposed at a position facing the movable portion 37 over substantially the entire surface and is connected to a driving extraction electrode 49 described below.

In addition, the driving electrode 43 faces the movable portion 37 with a space therebetween in the vertical direction (Z axis direction). When a voltage is applied between the driving electrode 43 and the movable portion 37, a vertical electrostatic force (electrostatic attraction) is generated to attract the movable portion 37 towards the substrate 32, so that the movable portion 37 is driven away from the substrate 33 by the electrostatic force.

That is, in the initial state in which a voltage is not applied between the driving electrode 43 and the movable portion 37, the movable portion 37 is held at a position close to the substrate 33 by the support beams 38. On the other hand, in a drive state in which a voltage is applied between the driving electrode 43 and the movable portion 37, an electrostatic force acts therebetween, and thus, the movable portion 37 is attracted to the driving electrode 43. As a result, the movable portion 37 is displaced vertically to a position in contact with stoppers 44 described below and is maintained at a position separated from the substrate 33.

In addition, in the switching element 31, the electrode distance between the signal electrodes 40 and the movable portion 37 varies according to the position of the movable portion 37. Therefore, the value of capacitance between the signal electrodes 40 and the movable portion 37 is selectively switched, and thus, the two signal electrodes 40 are switched between a conducting state and a cut-off state of a high-frequency signal.

In addition, the first substrate 32 preferably includes a plurality of stoppers 44 arranged to be surrounded by the driving electrode 43. In this case, the stoppers 44 are preferably made of the same or substantially the same insulating material as the stoppers 42. The stoppers 44 project toward the movable portion 37 beyond the driving electrode 43 and prevent short-circuiting between the driving electrode 43 and the movable portion 37.

The sealing frame 45 is disposed between the etched layer 34 and the second substrate 33 and has a shape of a substantially tetragonal frame along the periphery of the second substrate 33. Here, the sealing frame 45 is formed in the same or substantially the same manner as the sealing frame 14 according to the first preferred embodiment. In addition, an adhesive layer 41 is provided between the sealing frame 45 and the substrate 33.

In addition, a bonding film 45A preferably composed of a conductive metallic material, for example, a gold (Au) alloy or a gold, is provided on the sealing frame 45 on the side facing the support frame 39. Similarly, the same bonding film 39A as the bonding film 45A is provided on the support frame 39 on the side facing the sealing frame 45. These bonding films 39A and 45A are thermocompression-bonded under pressure so that the first and second substrate 32 and 33 are closely and securely adhered to each other. Consequently, the sealing frame 45 is bonded to the support frame 39 to define the airtight receiving space S that receives the movable portion 37, between the first and second substrate 32 and 33.

The remaining sacrificial layer 46 is disposed at a position of one of the fixed portions 35 in the first substrate 32 and is covered with the fixed portion 35. The remaining sacrificial layer 46 is defined by partially leaving the second sacrificial layer 53 when the first sacrificial layer 52 described below is etched away. In addition, an adhesive layer 36 is provided between the remaining sacrificial layer 46 and the substrate 32. Here, similar to the remaining sacrificial layer 16 according to the first preferred embodiment, the remaining sacrificial layer 46 including the second sacrificial layer 53 is formed by using a material having a higher ionization tendency than that of the etched layer 34 including the movable portion 37.

In addition, the remaining sacrificial layer 46 is electrically connected to the structure A, which includes the movable portion 37 and other elements, and the support frame 39, for example, through the fixed portion 35 and the adhesive layer 36. Further, the remaining sacrificial layer 46 is disposed in the receiving groove 35C of one of the fixed portions 35, the receiving groove 35C being in communication with the receiving space S. Therefore, when the first sacrificial layer 52 described below is etched away by the wet etching method to form the space between the movable portion 37 and the first substrate 32, the etching solution enters the receiving groove 35C. Therefore, the remaining sacrificial layer 46 is preferentially etched away as compared to the structure A, which includes the movable portion 37 and other elements, and the support frame 39.

The two signal extraction electrodes 47 are provided on the second substrate 33 and disposed at a position facing the movable portion 37. The two signal extraction electrodes 47 are formed in the same or substantially the same manner as the extraction electrode 17 according to the first preferred embodiment and are electrically connected to the respective signal electrodes 40. The two signal electrodes 40 are connected to an external detection circuit or other suitable circuit elements through the signal extraction electrodes 47.

Driving extraction electrodes 48 and 49 are provided on the first substrate 32 and are connected to the movable portion 37 and the driving electrode 43, respectively. Here, the driving extraction electrode 48 is preferably disposed, for example, at a position facing the other fixed portion 35 in which the remaining sacrificial layer 46 is not disposed, and is electrically connected to the movable portion 37 through the support beams 38 and other elements. On the other hand, the driving extraction electrode 49 is disposed at a position facing the movable portion 37 and is electrically connected to the driving electrode 43.

Similar to the signal extraction electrodes 47, each of the driving extraction electrodes 48 and 49 is formed preferably by filling a through hole with a conductive metallic material. The driving extraction electrodes 48 and 49 connect the movable portion 37 and the driving electrode 43 to a direct-current power supply 50. Thus, the power supply 50 preferably applies a direct-current voltage of, for example, about 3 V, between the movable portion 37 and the driving electrode 43, to generate an electrostatic attraction therebetween.

Next, a method for manufacturing the switching element 31 according to a preferred embodiment of the present invention is described with reference to FIGS. 14 to 19.

Figure 14:
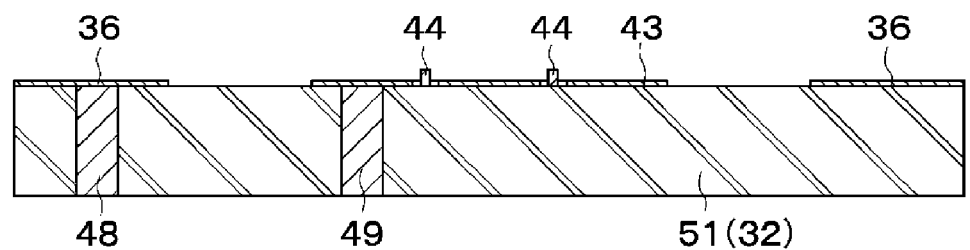
FIG. 14 is a longitudinal sectional view showing a state in which a driving electrode and other elements are formed on a glass substrate in a first substrate forming step.

First, in a first substrate forming step shown in FIG. 14, an insulating glass substrate 51 used as the first substrate 32 of the switching element 31 is prepared. Then, through holes are formed in the glass substrate 51 by a laser processing or micro blasting method, for example, and the through holes are preferably filled with a conductive metallic material, such as copper by, for example, plating, to form the driving extraction electrodes 48 and 49.

In addition, a conductive metal thin film is formed on the glass substrate 51 by, for example, a sputtering or vapor deposition method. By using the conductive metal thin film, the driving electrode 43 is formed on the surface of the glass substrate 51 at a position corresponding to the movable portion 37, and the adhesive layer 36 preferably composed of, for example, chromium (Cr) or platinum (Pt), is formed at positions corresponding to the fixed portions 35 and the support frame 39. In this step, the adhesive layer 36 and the driving electrode 43 are connected to the driving extraction electrodes 48 and 49, respectively.

Further, the stoppers 44 composed of an insulating material are formed on a central side of the glass substrate 51 to be surrounded by the driving electrode 43. The first substrate 32 including the driving electrode 43 and other elements is formed through the above-described process.

Figure 15:
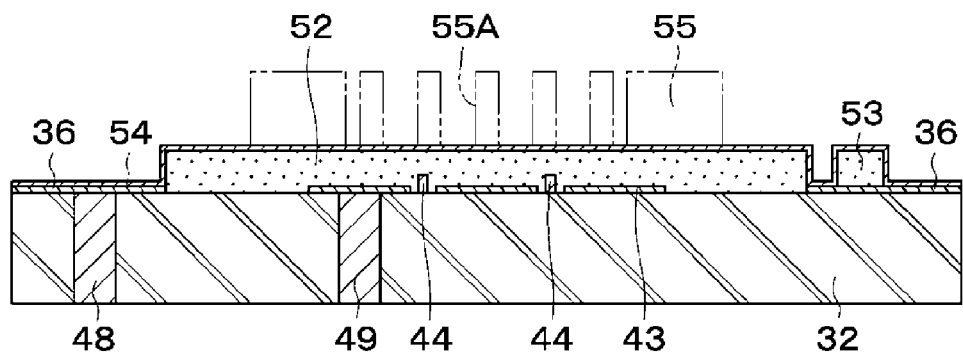
FIG. 15 is a longitudinal sectional view showing a state where first and second sacrificial layers and other elements are formed on a first substrate in a sacrificial layer forming step.

Next, in a sacrificial layer forming step shown in FIG. 15, the first sacrificial layer 52 preferably composed of, for example, titanium (Ti), is formed on the surface of the substrate 32 at a position corresponding to the movable portion 37 and the support beams 38. In addition, the second sacrificial layer 53 preferably composed of, for example, the same or substantially the same material as the first sacrificial layer 52 is formed at a position which is different from the first sacrificial layer 52 and which corresponds to the receiving groove 35C in one of the fixed portions 35. In this step, the first and second sacrificial layers 52 and 53 are formed by a material having a higher ionization tendency than those of the structure A, which includes the movable portion 37, and the support frame 39, so that the first and second sacrificial layers are etched away more easily than the movable portion 37.

Next, in a seed layer forming step, a seed layer 54 is formed as a plating electrode layer, which includes a metal thin film, over the entire or substantially the entire surface of the substrate 32 to cover the first and second sacrificial layers 52 and 53 preferably by using, for example, the same conductive metallic material (for example, copper) as the movable portion 37. In this step, the seed layer 54 need not necessarily cover the entire surface of the substrate 32 and may be formed to cover at least the surfaces of the first and second sacrificial layers 52 and 53 in an area corresponding to the movable portion 37 etc., without covering the other areas, in order to form the movable portion 37 and other elements on the surfaces of the first and second sacrificial layers 52 and 53.

Next, in a plating mold forming step, as shown by a two-dot chain line in FIG. 15, a resist pattern 55 is formed on the surface of the seed layer 54, the resist pattern 55 having openings 55A passing in the thickness direction at positions corresponding to the fixed portions 35, the movable portion 37, and the support beams 38. In this step, the resist pattern 55 is preferably formed by applying a mold material (for example, a photoresist material) which defines a plating mold and prevents growth of plating and then performing predetermined patterning.

Figure 16:
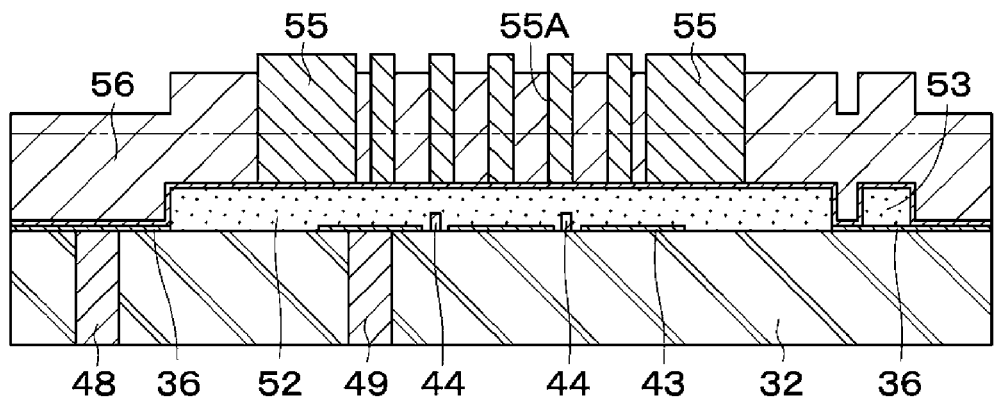
FIG. 16 is a longitudinal sectional view showing a state in which a metal layer is formed to cover first and second sacrificial layers in a plating step.

Next, in a metal layer forming step shown in FIG. 16, a metal layer 56 (plating layer) preferably composed of a conductive metallic material, such as copper, is grown, as a member to be etched, by electroplating using the seed layer 54. As a result, on the surface of the substrate 32, the metal layer 56 is laminated on the surface of the substrate 32 through the first and second sacrificial layers 52 and 53 so as to be disposed in the openings 55A of the resist pattern 55 and to be in contact with the first and second sacrificial layers 52 and 53. In the metal layer 56, a portion which covers the first sacrificial layer 52 and corresponds to the structure A defines a first metal layer. In addition, in the metal layer 56, a portion which covers the second sacrificial layer 53 defines a second metal layer.

When the metal layer 56 is grown beyond the thickness dimension of the fixed portions 35, plating is terminated, and the resist pattern 55 is removed. As a result, in the seed layer 54, an area disposed in contact with the back side (lower side) of the resist pattern 55 and between the resist pattern 55 and the first sacrificial layer 52 is exposed. Therefore, the exposed area of the seed layer 54 is removed using dilute hydrofluoric acid (HF) or other suitable material, for example.

Figure 17:
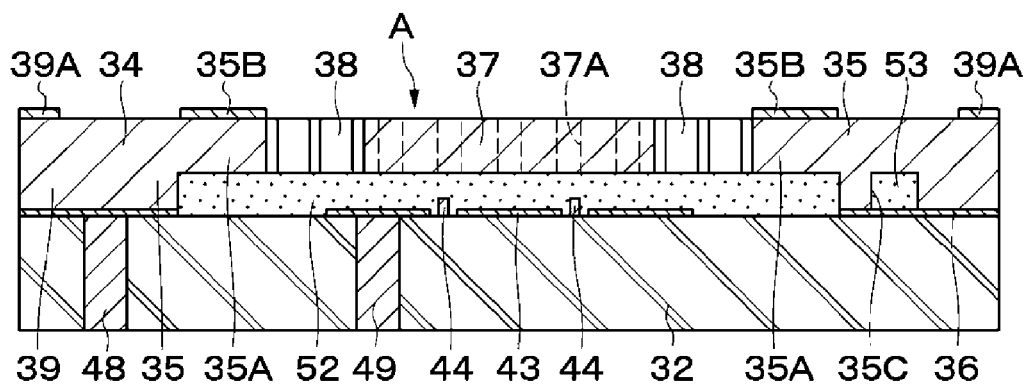
FIG. 17 is a longitudinal sectional view showing a state in which a surface of a metal layer is smoothed to form an etched layer including fixed portions, a movable portion, support beams, and other elements in a surface smoothing step.

Next, in a surface smoothing step shown in FIG. 17, the surface of the metal layer 56 is polished to a flat state up to a position shown by a two-dot chain line in FIG. 16 by using, for example, a CMP method. This polishing forms the etched layer 34 including the fixed portions 35, the movable portion 37, the support beams 38, and the support frame 39, which have smoothed surfaces. At the same time, the remaining seed layer 54 is integrated with the etched layer 34. In addition, the second sacrificial layer 53 is electrically connected to the movable portion 37 and the support frame 39 through the fixed portions 35 and the adhesive layer 36.

Next, in a bonding film forming step, for example, a metal thin film of gold is preferably formed on the surface of the support frame 39 by using, for example, a vapor deposition method or a sputtering method to form the bonding film 39A including a metal thin film of gold or other suitable material. In addition, the energizing film 35B is formed on the surface of each of the beam connecting portions 35A. Further, an adhesive layer of, for example, chromium or platinum, is preferably provided between the etched layer 34 and the bonding film 39A and between the etched layer 34 and the energizing film 35B in order to improve adhesion therebetween.

Figure 18:
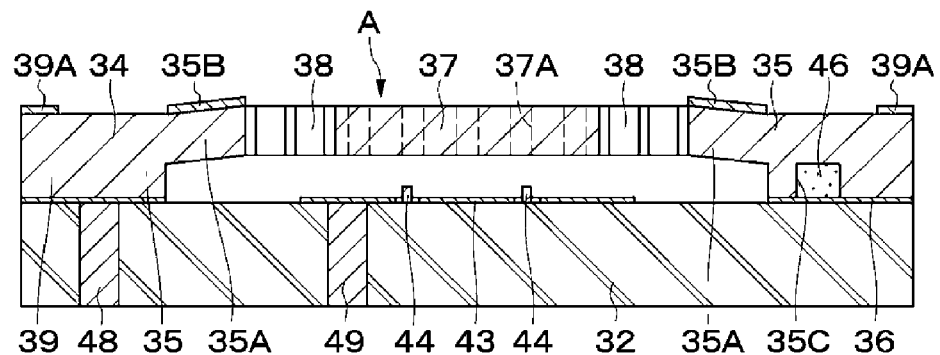
FIG. 18 is a longitudinal sectional view showing a state in which a first sacrificial layer is removed in a sacrificial layer removing step.

Next, in a sacrificial layer removing step shown in FIG. 18, the first sacrificial layer 52 is entirely etched away by the wet etching method, for example, preferably using an etching solution such as dilute hydrofluoric acid, for example. At the same time, the second sacrificial layer 53 is also etched away. However, since a plurality of through holes 37A are formed in the movable portion 37, the first sacrificial layer 52 is soaked with the etching solution with a greater contact area. In contrast, the second sacrificial layer 53 contacts the etching solution only at both end portions of the receiving groove 35C. Therefore, the first sacrificial layer 52 is preferably removed earlier than the second sacrificial layer 53. Thus, etching is terminated in a state in which the second sacrificial layer 53 partially remains after the first sacrificial layer 52 is entirely etched away. This causes a state in which the movable portion 37 and the support beams 38 face the substrate 32 with a space therebetween and float above the substrate 32. In this state, tensile stress acts on the beam connecting portions 35A from the energizing films 35B, and thus, the movable portion 37 is energized in a direction away from the first substrate 32.

On the other hand, in a second substrate forming step, an insulating glass substrate 57 is prepared as the second substrate 33 of the switching element 31, and the signal extraction electrodes 47 including through holes passing through in the thickness direction are formed in the glass substrate 57. In addition, a conductive metal thin film preferably composed of, for example, chromium (Cr) or platinum (Pt), is formed on the back side of the glass substrate 57. By using this metal thin film, the adhesive layer 41 is formed on the back side of the glass substrate 57 at positions corresponding to the signal electrodes 40 and the sealing frame 45.

Next, the signal electrodes 40 and the sealing frame 45 are formed on the adhesive layer 41 preferably by using a conductive metallic material, for example, copper. In this step, the signal electrodes 40 are connected to the signal extraction electrodes 47. Then, a plurality of the stoppers 42 preferably composed of an insulating material are formed on the back sides of the signal electrodes 40 so as to face the movable portion 37. In addition, the bonding film 45A is formed on the back side of the sealing frame 45. The second substrate 33 including the signal electrodes 40 and other elements is formed by the above-described process (refer to FIG. 19).

Figure 19:
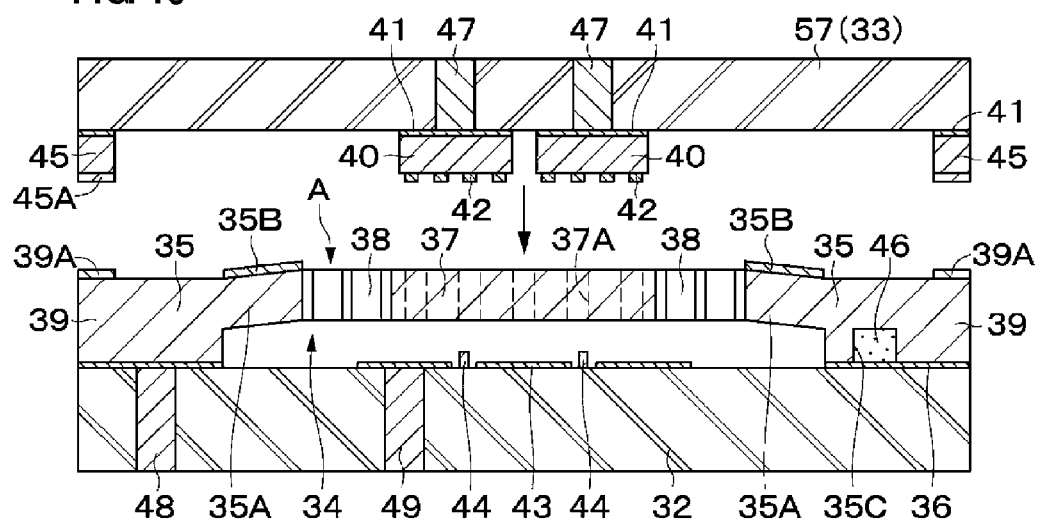
FIG. 19 is a longitudinal sectional view showing a state in which a sealing frame of a second substrate is pressure-bonded to a support frame of an etched layer in a pressure bonding step.

Next, in a pressure-bonding step shown in FIG. 19, the sealing frame 45 of the second substrate 33 is thermocompression-bonded to the support frame 39 of the etched layer 34. Specifically, the support frame 39 and the sealing frame 45 are preferably heated to a predetermined temperature, for example, within a range from about 200° C. to about 400° C. and, at the same time, a predetermined load (for example, a load of about 4 t for a 4-inch wafer) is applied so that the support frame 39 and the sealing frame 54 are closely and securely adhered to each other. Consequently, the bonding films 39A and 45A of the support frame 39 and the sealing frame 45, respectively, are pressure-bonded to each other, and the second substrate 33 and the etched layer 34 are bonded and fixed to each other. As a result, the airtight receiving space S is defined between the first and second substrates 32 and 33, and the movable portion 37 is disposed in the receiving space S. In addition, the movable portion 37 is disposed at a position facing the signal electrodes 40 of the substrates 32 and 33 so as to be displaceable in the thickness direction, thereby completing the switching element 31.

The switching element 31 according to a preferred embodiment is manufactured using the above-described manufacturing method, and the next operation thereof is described.

Figure 11:
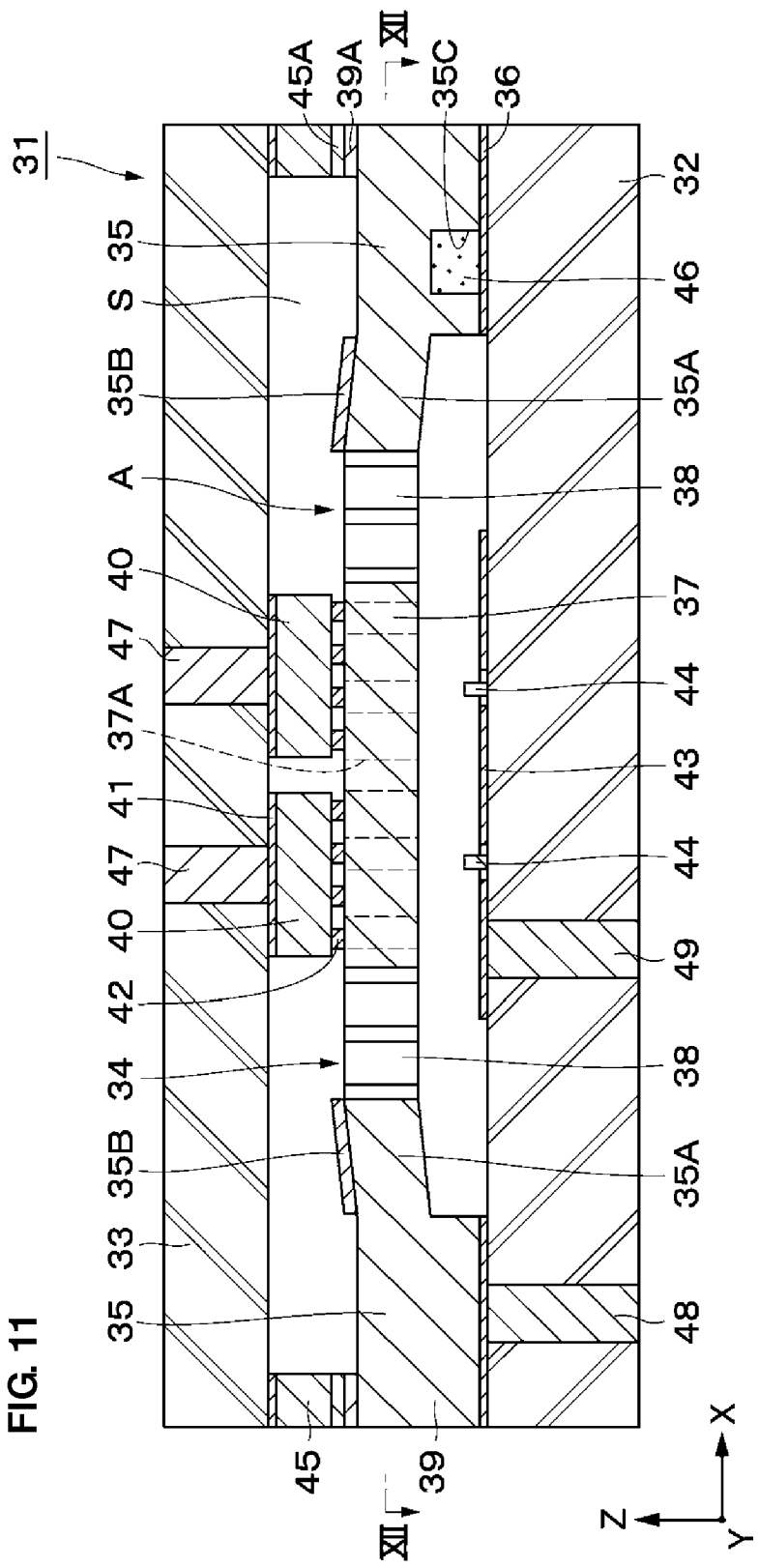
FIG. 11 is a longitudinal sectional view showing the switching element shown in FIG. 10.
Figure 12:
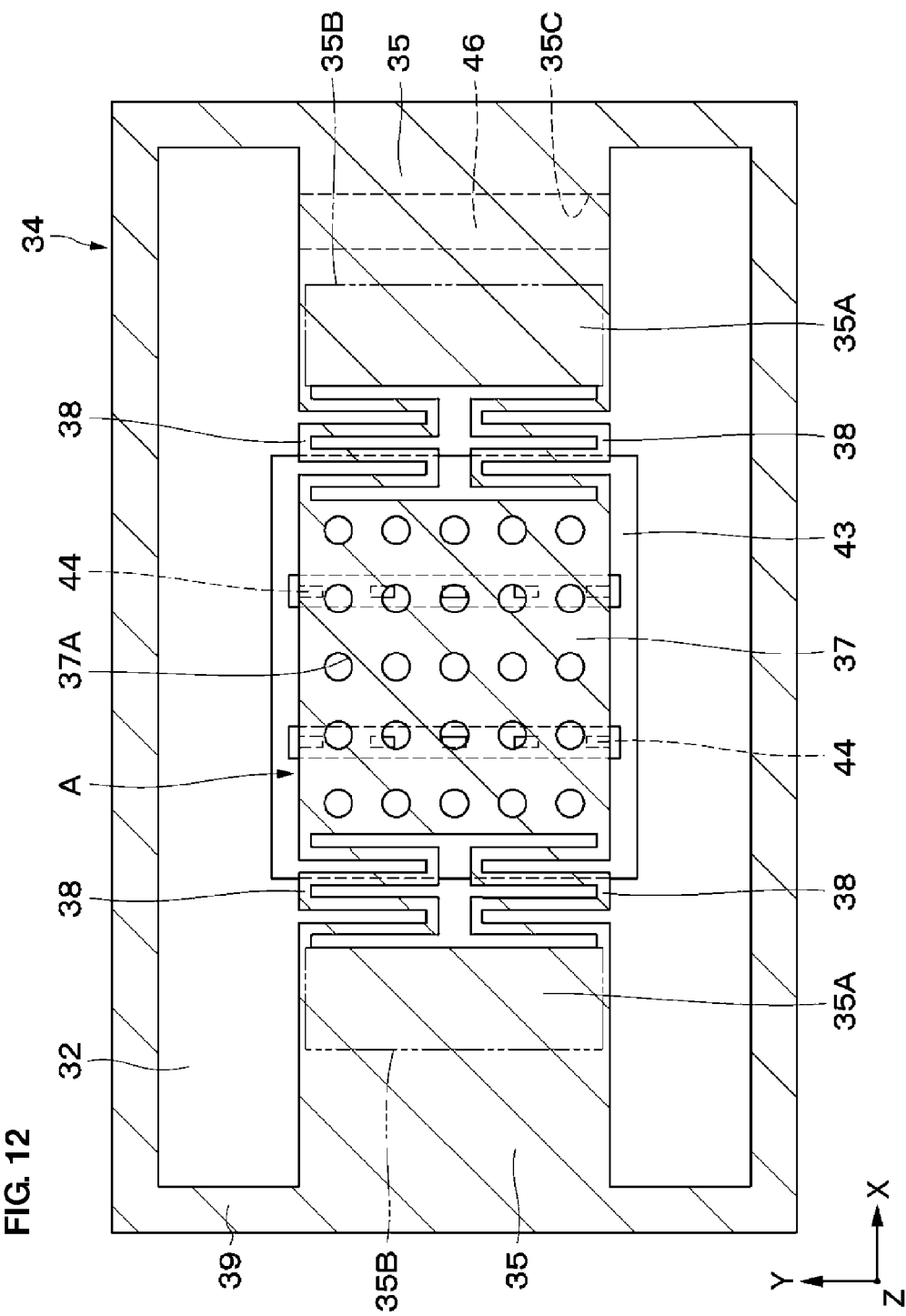
FIG. 12 is a sectional view of the switching element as viewed from direction XII-XII shown by arrows in FIG. 11.

First, in the initial state in which a voltage is not applied between the movable portion 37 and the driving electrode 43, as shown in FIG. 11, the movable portion 37 is maintained at a position close to the signal electrodes 40, and a capacitance between the movable portion 37 and the signal electrodes 40 is maximized.

Figure 13:
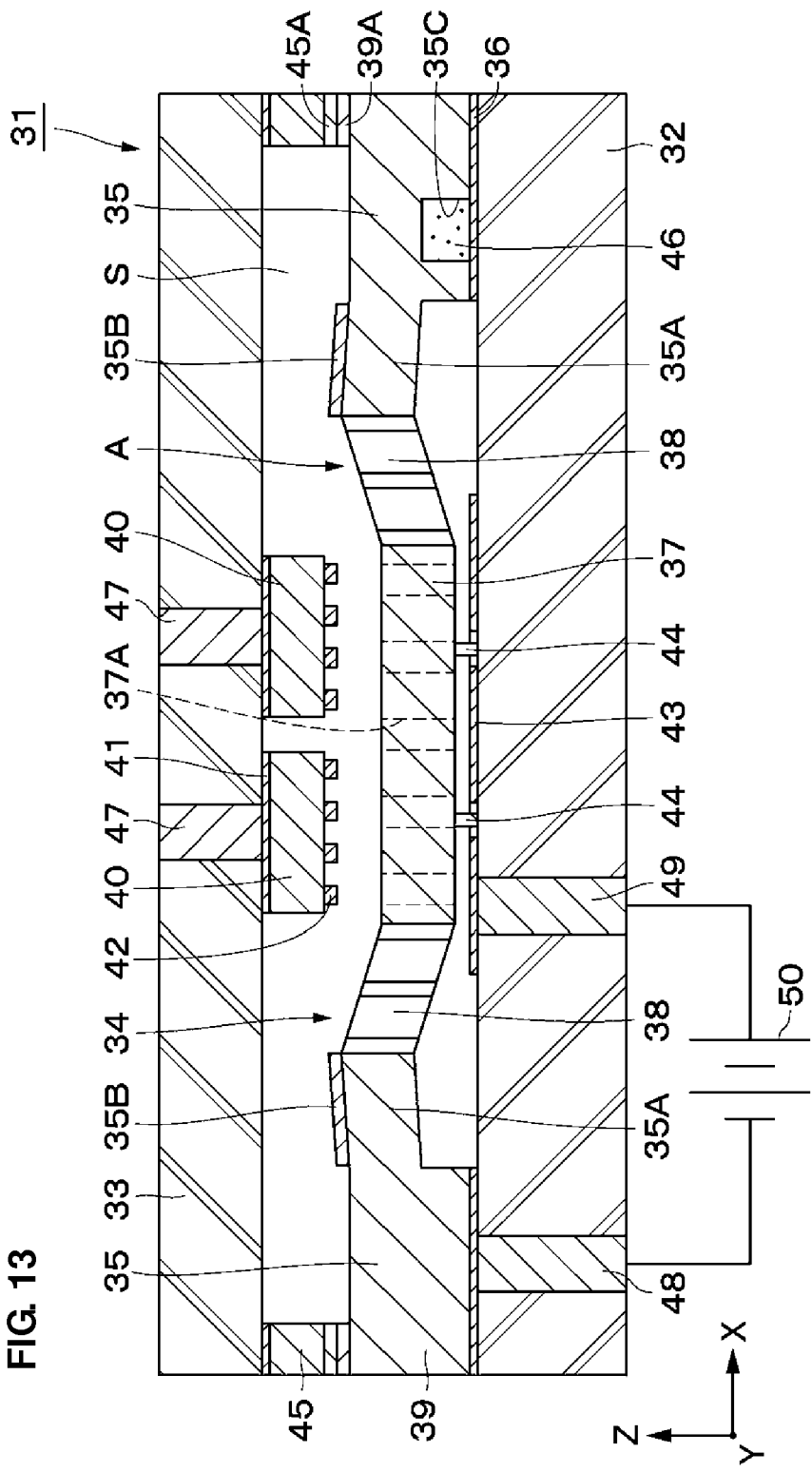
FIG. 13 is a longitudinal sectional view corresponding to FIG. 11 and showing a state in which a movable portion is displaced by an electrostatic force.

In addition, as shown in FIG. 13, in a drive state in which a voltage is applied between the movable portion 37 and the driving electrode 43, an electrostatic force is generated therebetween. In this state, the movable portion 37 is vertically displaced to a position in contact with the stoppers 44 while flexurally deforming the support beams 38, and the movable portion 37 is maintained at a position separated from the signal electrodes 40. As a result, a capacitance between the movable portion 37 and the signal electrodes 40 is minimized.

Therefore, in the switching element, the capacitance between the movable portion 37 and the signal electrodes 40 is switched in response to the presence of the applied voltage. Thus, in the switching element 31, the two signal electrodes 40 can be switched between transmission and cut-off states of a high-frequency signal according to the capacitance.

In the preferred embodiment configured as described above, substantially the same operational advantages as the first preferred embodiment are obtained.

Figure 20:
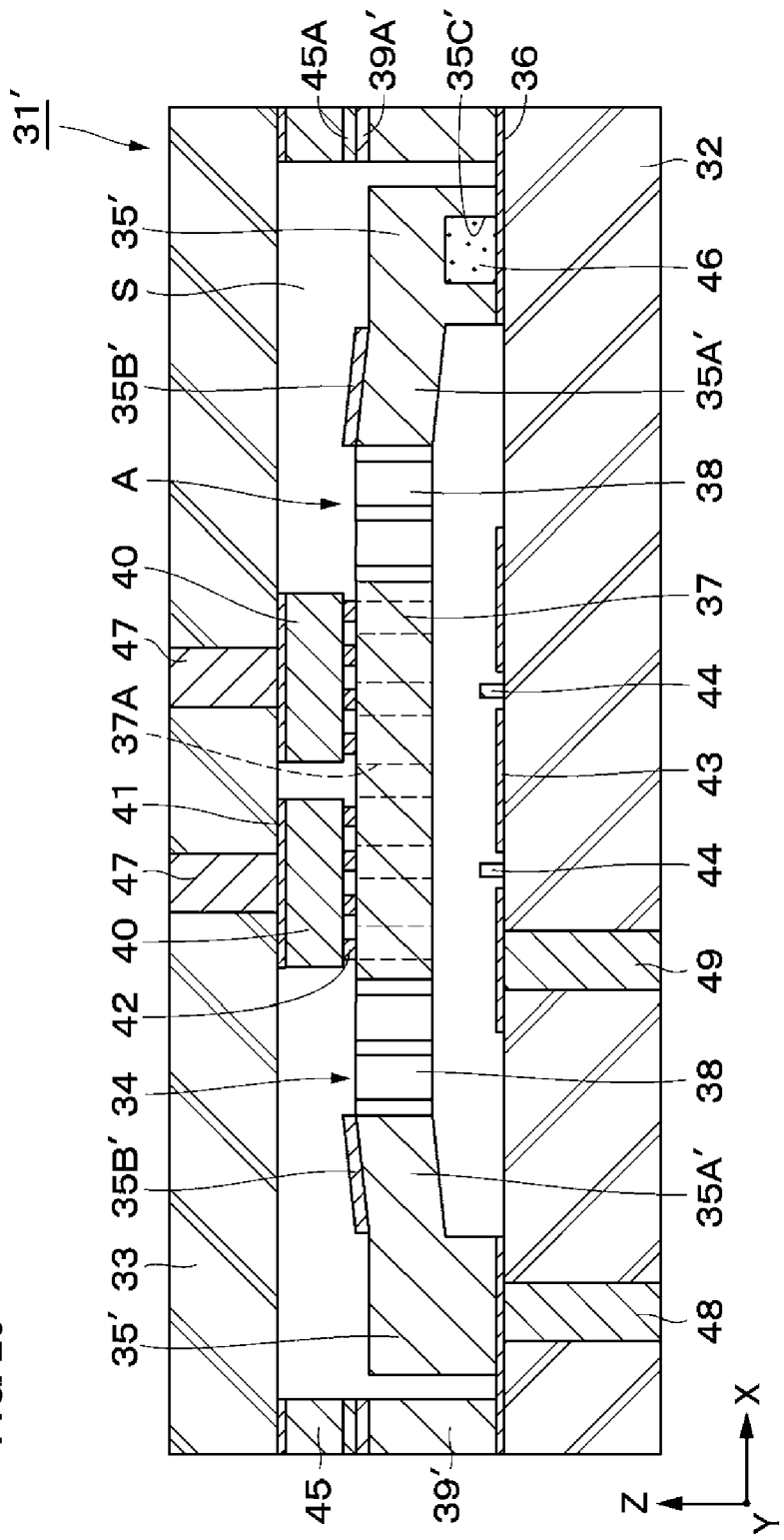
FIG. 20 is a longitudinal sectional view showing a switching element according to a first modified example of a preferred embodiment of the present invention.
Figure 21:
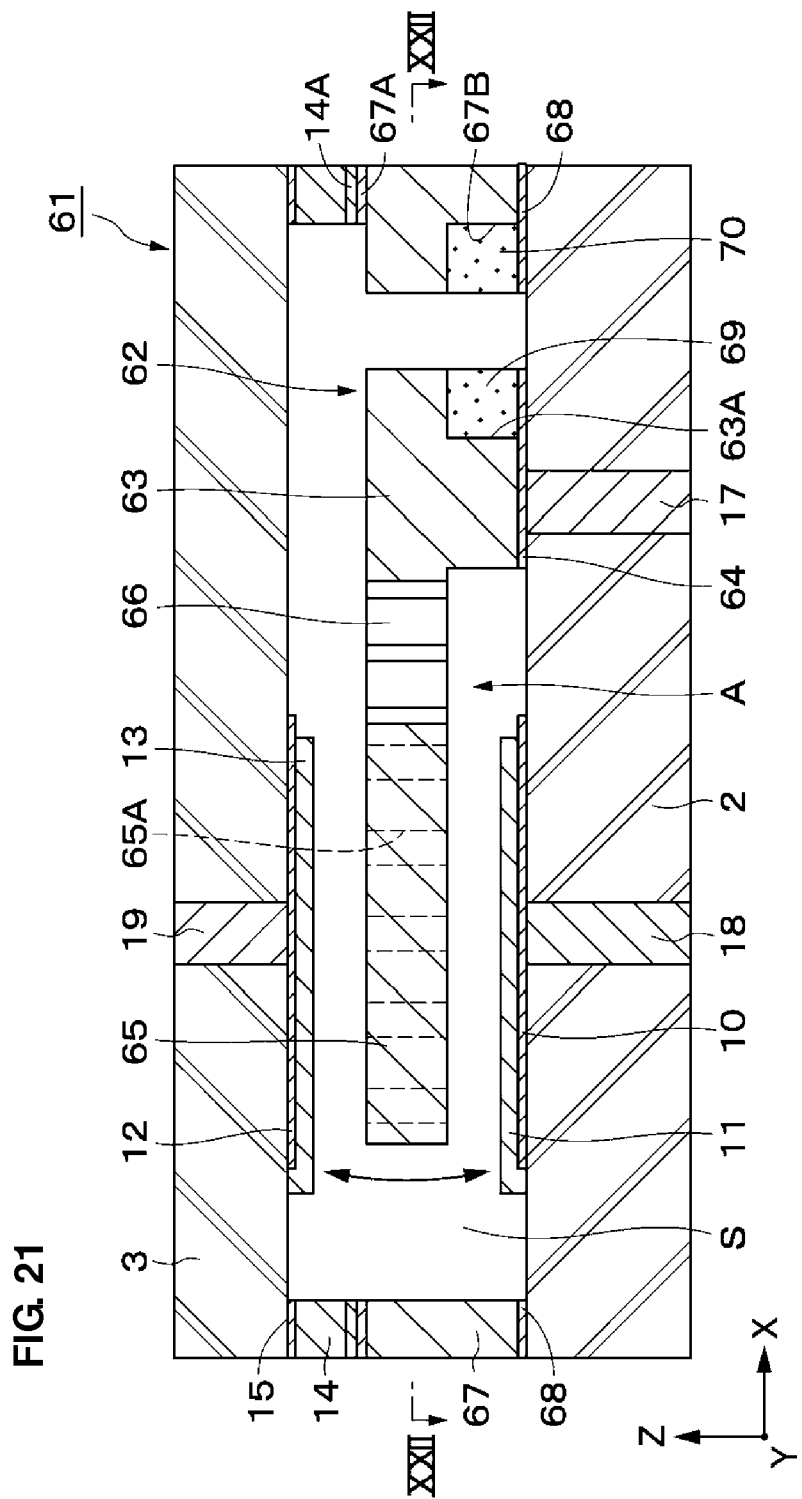
FIG. 21 is a longitudinal sectional view showing an acceleration sensor according to a third preferred embodiment of the present invention.
Figure 22:
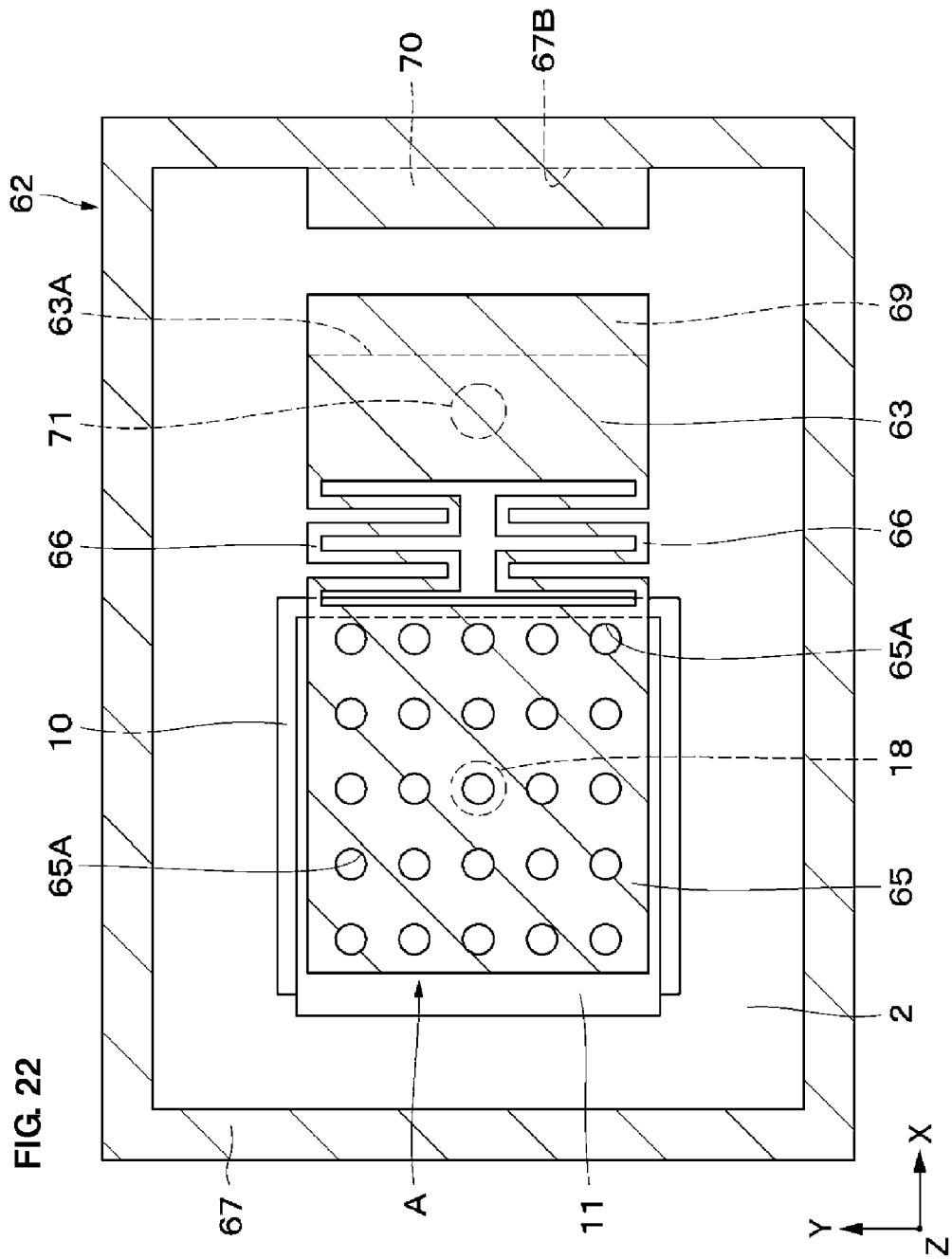
FIG. 22 is a sectional view of the acceleration sensor as viewed from direction XXII-XXII shown by arrows in FIG. 21.

In the first and second preferred embodiments, the fixed portions 5 (35) and the support frame 9 (39) are preferably integrally formed using the same material. However, preferred embodiments of the present invention are not limited to this, and, for example, as in a switching element 31' according to a first modified example of a preferred embodiment shown in FIG. 20, a structure A and a support frame 39' may be independently formed as long as they are electrically connected to a remaining sacrificial layer 46 including a remaining portion of a second sacrificial layer. In this case, fixed portions 35' including beam connecting portions 35A' of the structure A, energizing films 35B', and a receiving groove 35C', the support frame 39' with a bonding film 39A' provided thereon, and the remaining sacrificial layer 46 are preferably provided on, for example, the surface of an adhesive layer 36 so that the fixed portions 35' and the support frame 39' are electrically connected to the remaining sacrificial layer 46 through the adhesive layer 36.

FIGS. 21 to 28 show a third preferred embodiment of the present invention. The third preferred embodiment is configured such that a structure and a support frame are provided on a first substrate so as to be insulated from each other, and respective remaining sacrificial layers are provided on the structure and the support frame. In the third preferred embodiment, the same components as in the first preferred embodiment are denoted by the same reference numerals, and description thereof is omitted.

An acceleration sensor 61 according to the third preferred embodiment preferably includes first and second substrates 2 and 3, an etched layer 62 sandwiched between the substrates 2 and 3 and formed by etching, and a sealing frame 14 provided between the etched layer 62 and the second substrate 3.

The etched layer 62 is preferably formed using a conductive metallic material, such as copper, for example, in substantially the same manner as the etched layer 4 according to the first preferred embodiment. In addition, a fixed portion 63, a movable portion 65, support beams 66, and a support frame 67 are formed in the etched layer 62.

The fixed portion 63 is formed in the etched layer 62 and is fixed to the first substrate 2. The fixed portion 63 is disposed, for example, on one side in the X axis direction in the same or substantially the same manner as the fixed portion 5 according to the first preferred embodiment. However, the fixed portion 63 is electrically insulated from the support frame 67 described below. In addition, an adhesive layer 64 preferably composed of a conductive metallic material, for example, chromium (Cr) or platinum (Pt), is provided between the fixed portion 63 and the substrate 2 in order to improve adhesion therebetween. Further, an elongated receiving groove 63A is preferably provided in the fixed portion 63 and arranged to extend in the Y-axis direction, a structure A-side remaining sacrificial layer 69 described below being provided in the receiving groove 63A. In addition, the fixed portion 63 defines, together with the movable portion 65 and the support beams 66 described below, a functional portion that detects an acceleration.

The movable portion 65 is formed in the etched layer 62 and is supported on the fixed portion 63 through the support beams 66 described below. The movable portion 65 is preferably configured in substantially the same manner as the movable portion 7 according to the first preferred embodiment. Therefore, the movable portion 65 faces each of the substrates 2 and 3 with a space therebetween and is displaceable in the thickness direction (Z-axis direction). Thus, the movable portion 65 is displaced in the thickness direction in response to an inertial force due to an acceleration.

In addition, the movable portion 65 includes a plurality of through holes 65A that extend through the movable portion 65 in the thickness direction. The through holes 65A function to promote corrosion of a first sacrificial layer 73 described below when the movable portion 65 is formed by etching. Also, the through holes 65A function to decrease the resistance due to surrounding gas after manufacture of the acceleration sensor 61.

In addition, the movable portion 65 is preferably formed using a metal layer 78 as a member to be etched as described below and defines the structure A together with the fixed portion 63 and the support beams 66. The structure A is not limited to a configuration including only a functional portion including the fixed portion 63, the movable portion 65, and the support beams 66, but the structure A may also include various electrodes, wiring, circuit elements, and other elements, for example.

For example, the two support beams 66 are preferably provided between the movable portion 65 and the fixed portion 63 to support the movable portion 65 in a cantilever manner so that the movable portion 65 is displaceable in the vertical direction (Z axis direction). The support beams 66 are formed in substantially the same manner as the support beams 8 according to the first preferred embodiment, so as to provide a space between each of the substrates 2 and 3. In addition, the base end portion of each of the support beams 66 is connected to the fixed portion 63, and the distal end is connected to the movable portion 65. Further, each of the support beams 66 is torsionally or flexurally deformed in the vertical direction when the movable portion 65 is displaced toward the substrate 2 or 3.

The support frame 67 is formed in the etched layer 62 and has, for example, a tetragonal frame shape extending along the periphery of the substrates 2 and 3. The support frame 67 surrounds the structure A including the movable portion 65, the support beams 66, and other elements. In addition, the support frame 67 preferably has, for example, the same or substantially the same thickness dimension as the fixed portion 63 and supports, together with a sealing frame 14, an airtight receiving space S between the substrates 2 and 3. The support frame 67 also defines a smooth surface member having a smoothed surface.

Further, the support frame 67 preferably includes the same bonding film 67A as a bonding film 14A, which is disposed on the surface side facing the sealing frame 14. These bonding films 14A and 67A are thermocompression-bonded together under pressure so that the first and second substrate 2 and 3 are closely adhered to each other. As a result, the sealing frame 14 is bonded to the support frame 67 to define the airtight receiving space S which receives the movable portion 65 between the first and second substrates 2 and 3.

In addition, an adhesive layer 68 preferably composed of substantially the same conductive metallic material as the adhesive layer 64 is formed between the support frame 67 and the substrate 2 in order to improve adhesion therebetween. In this case, the adhesive layers 64 ad 68 are separately provided so as to be insulated from each other. On the other hand, the support frame 67 preferably includes an elongated receiving groove 67B extending in the Y axis direction, a support frame 67-side remaining sacrificial layer 70 being provided in the receiving groove 67B.

The structure A-side remaining sacrificial layer 69 is disposed at a position in the fixed portion 63 of the first substrate 2 and is covered with the fixed portion 63. The remaining sacrificial layer 69 is formed by leaving a portion of the second sacrificial layer 74 when the first sacrificial layer 73 described below is etched away. The remaining sacrificial layer 69 including the second sacrificial layer 74 is preferably formed using a material, for example, titanium (Ti), nickel (Ni), iron (Fe), chromium (Cr), or aluminum (Al), which has a higher ionization tendency than that of the etched layer 62 including the movable portion 65.

In addition, the remaining sacrificial layer 69 is electrically connected to the structure A including the movable portion 65 through, for example, the fixed portion 63 and the adhesive layer 64. The remaining sacrificial layer 69 is disposed in the holding groove 63A of the fixed portion 63, the holding groove 63A being in communication with the receiving space S. Therefore, when the first sacrificial layer 73 described below is etched away by the wet etching method to form a space between the movable portion 65 and the first substrate 2, the etching solution enters the receiving groove 63A. Consequently, the remaining sacrificial layer 69 is etched away to a greater extent than the structure A.

The support frame 67-side remaining sacrificial layer 70 is disposed at a position in the support frame 67 of the first substrate 2 and is covered with the support frame 67. The remaining sacrificial layer 70 is formed by leaving a portion of the third sacrificial layer 75 when the first sacrificial layer 73 described below is etched away. The remaining sacrificial layer 70 including the third sacrificial layer 75 is preferably formed using a material having a higher ionization tendency than that of the metallic material of the etched layer 62 including the movable portion 65. In this case, the remaining sacrificial layer 70 may be formed by using a material which is the same as or different from the remaining sacrificial layer 69.

In addition, the remaining sacrificial layer 70 is electrically connected to the support frame 67. The remaining sacrificial layer 69 is disposed in the receiving groove 67B of the support frame 67, the receiving groove 67B being in communication with the receiving space S. Therefore, when the first sacrificial layer 73 described below is etched away by the wet etching method, the etching solution enters the receiving groove 67B. Consequently, the remaining sacrificial layer 70 is etched away to a greater extent than the support frame 67.

A movable-side extraction electrode 71 is disposed at a position corresponding to the fixed portion 63 in the first substrate 2, and is electrically connected to the movable portion 65 through the fixed portion 63 and the support beams 66. The movable-side extraction electrode 71 is preferably formed by forming a via hole (through hole) for signals, which extends through the substrate 2 in the thickness direction, by, for example, a laser processing or micro blasting method, and then filling the through hole with a conductive metallic material such as copper (Cu).

Next, a method for manufacturing the acceleration sensor 61 according to a preferred embodiment of the present invention is described with reference to FIGS. 23 to 28.

Figure 23:
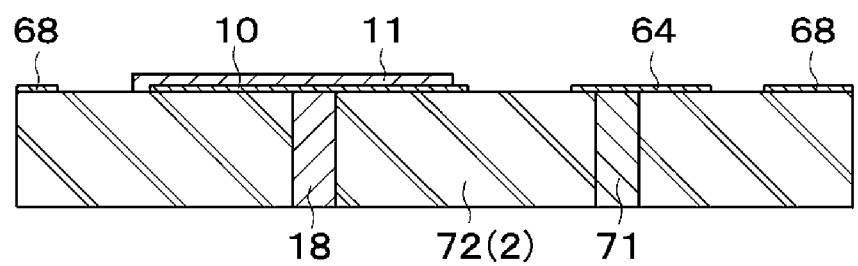
FIG. 23 is a longitudinal sectional view showing a state in which a first fixed electrode and other elements are formed on a glass substrate in a first substrate forming step.

First, in a first substrate forming step shown in FIG. 23, an insulating glass substrate 72 used for the first substrate 2 of the acceleration sensor 61 is prepared. Then, through holes are formed in the glass substrate 72 by a laser processing or micro blasting method, and the through holes are filled with a conductive metallic material, such as copper, for example, by plating to form the movable-side extraction electrode 71 and the fixed-side extraction electrode 18.

In addition, a conductive metal thin film is formed on the glass substrate 72 by, for example, a sputtering or vapor deposition method. By using this thin film, on the surface of the glass substrate 72, the fixed electrode 10 is formed at a position corresponding to the movable portion 65, the adhesive layer 64 is formed at a position corresponding to the fixed portion 63, and the adhesive layer 68 is formed at a position corresponding to the support frame 67. In this step, the adhesive layer 64 and the fixed electrode 10 are connected to the extraction electrodes 71 and 18, respectively. Then, an insulating film 11 is formed on the surface of the fixed electrode 10. The first substrate 2 including the fixed electrode 10 and other elements is formed through the above-described process.

Figure 24:
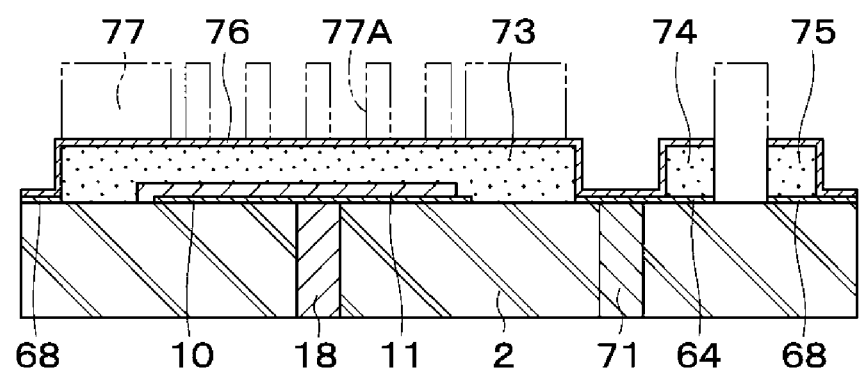
FIG. 24 is a longitudinal sectional view showing a state where first to third sacrificial layers and other elements are formed on a first substrate in a sacrificial layer forming step.

Next, in a sacrificial layer forming step shown in FIG. 24, the first sacrificial layer 73 preferably composed of, for example, titanium (Ti), is formed on the surface of the substrate 2 at positions corresponding to the movable portion 65 and the support beams 66. In addition, the second sacrificial layer 74 preferably composed of, for example, the same or substantially the same material as the first sacrificial layer 73 is formed at a position different from the first sacrificial layer 73 and corresponding to the receiving groove 63A in the fixed portion 63. Further, the third sacrificial layer 75 preferably composed of, for example, the same or substantially the same material as the first sacrificial layer 73 is formed at a position different from the first and second sacrificial layers 73 and 74 and corresponding to the receiving groove 67B in the support frame 67.

In this step, the first to third sacrificial layers 73 to 75 are formed with a material having a higher ionization tendency than the structure A, which includes the movable portion 65, and the support frame 67, so that the first to third sacrificial layers are etched away to a greater extent than the movable portion 65. The surface of the first sacrificial layer 73 is preferably smoothed by polishing or other suitable method.

Next, in a seed layer forming step, a seed layer 76 is formed as a plating electrode layer over the entire or substantially the entire surface of the substrate 2 so as to cover the first to third sacrificial layers 73 to 75 using, for example, the same conductive metallic material (for example, copper) as the movable portion 65. In this step, the seed layer 76 is preferably formed of, for example, a metal thin film having a thickness of about 0.1 μm or less and functions as a basic portion for plating. The seed layer 76 need not necessarily cover the entire surface of the substrate 2 and may be formed to cover at least the surfaces of the first to third sacrificial layers 73 to 75 in an area corresponding to the movable portion 65, without covering the other areas, in order to form the movable portion 65 on the surfaces of the first to third sacrificial layers 73 to 75.

Next, in a plating mold forming step, as shown by a two-dot chain line in FIG. 24, a resist pattern 77 is formed, which includes openings 77A at positions corresponding to the fixed portion 63, the movable portion 65, and the support beams 66. In this step, the resist pattern 77 is preferably formed by applying a mold material (for example, a photoresist material) which defines a plating mold and prevents growth of plating and then performing predetermined patterning. In addition, the resist pattern 77 preferably has a thickness dimension (for example, about 15 μm to about 30 μm) that is greater than the thickness dimension (for example, about 10 μm) of the fixed portion 63.

Figure 25:
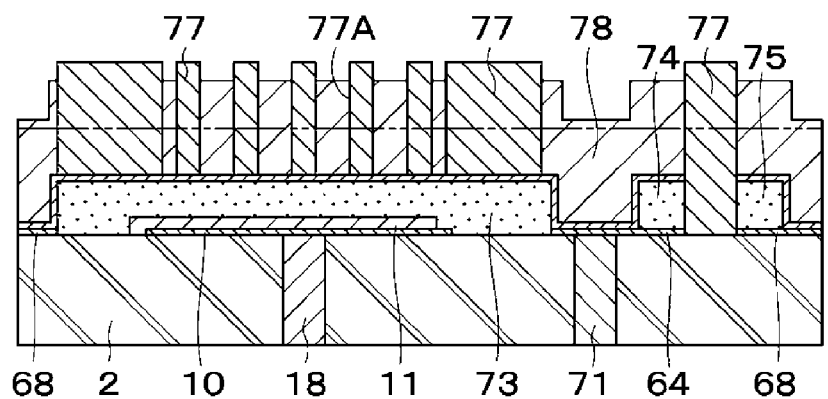
FIG. 25 is a longitudinal sectional view showing a state in which a metal layer is formed to cover first to third sacrificial layers in a plating step.

Next, in a metal layer forming step shown in FIG. 25, a metal layer 78 (plating layer) preferably composed of a conductive metallic material, such as copper, for example, is grown, as a member to be etched, by electroplating using the seed layer 76. As a result, on the surface of the substrate 2, the metal layer 78 is laminated on the surface of the substrate 2 through the first to third sacrificial layers 73 to 75 so as to be disposed in the openings 77A of the resist pattern 77 and so as to be in contact with the first to third sacrificial layers 73 to 75. In the metal layer 78, a portion which covers the first sacrificial layer 73 and corresponds to the structure A defines a first metal layer. In addition, in the metal layer 78, a portion which covers the second sacrificial layer 74 defines a second metal layer. Further, in the metal layer 78, a portion which covers the third sacrificial layer 75 and corresponds to the support frame 67 defines a third metal layer. When the metal layer 78 is grown beyond the thickness dimension of the fixed portion 63 and other elements, plating is terminated, and the resist pattern 77 is removed.

Figure 26:
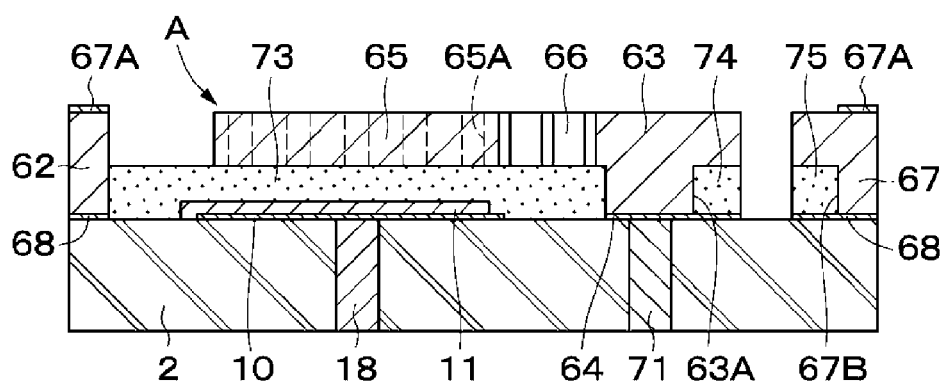
FIG. 26 is a longitudinal sectional view showing a state in which a surface of a metal layer is smoothed to form an etched layer including a fixed portion, a movable portion, support beams, and other elements in a surface smoothing step.

Next, in a surface smoothing step shown in FIG. 26, the surface of the metal layer 78 is preferably polished to a flat state up to a position shown by a two-dot chain line in FIG. 25 by using, for example, a CMP method. This polishing forms the etched layer 62 including the fixed portion 63, the movable portion 65, the support beams 66, and the support frame 67, which have smoothed surfaces. In addition, the remaining seed layer 76 is integrated with the etched layer 62. Further, the second sacrificial layer 74 is electrically connected to the structure A including the movable portion 65 and other elements through the fixed portion 63 and the adhesive layer 64. On the other hand, the third sacrificial layer 75 is electrically connected to the support frame 67.

Next, in a bonding film forming step, for example, a metal thin film of gold (Au) is preferably formed on the surface of the support frame 67 by using, for example, a vapor deposition method or a sputtering method to form the bonding film 67A having a thickness dimension of about 0.3 μm to about 0.7 μm, for example. In addition, an adhesive layer of, for example, chromium (Cr) or platinum (Pt), is preferably provided between the metal thin film serving as the bonding film 67A and composed of gold and the etched layer 62 composed of copper in order to enhance adhesion therebetween.

Figure 27:
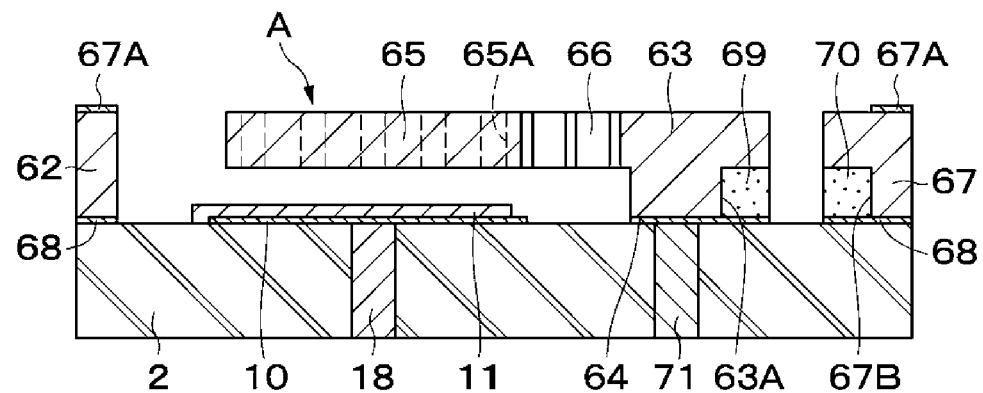
FIG. 27 is a longitudinal sectional view showing a state where a first sacrificial layer is removed in a sacrificial layer removing step.

Next, in a sacrificial layer removing step shown in FIG. 27, the first sacrificial layer 73 is entirely etched away by the wet etching method using, for example, an etching solution such as hydrofluoric acid diluted to 1/50. At the same time, the second and third sacrificial layers 74 and 75 are also etched away. However, since a plurality of through holes 65A are provided in the movable portion 65, the first sacrificial layer 73 is soaked with the etching solution with a greater contact area. In contrast, the second and third sacrificial layers 74 and 75 contact the etching solution only on the open side portions of the receiving grooves 63A and 67B. Therefore, the first sacrificial layer 73 is removed earlier than the second and third sacrificial layers 74 and 75. Thus, etching is terminated in a state in which the second and third sacrificial layers 74 and 75 partially remain after the first sacrificial layer 73 is entirely etched away. This causes a state in which the movable portion 65 and the support beams 66 face the substrate 2 with a space therebetween and float above the substrate 2.

On the other hand, in a second substrate forming step, an insulating glass substrate 79 is prepared as the second substrate 3 of the acceleration sensor 61, and the second fixed-side extraction electrode 19 including a through hole extending through in the thickness direction is formed in the glass substrate 79. In addition, as in the first substrate forming step, the second fixed electrode 12, the adhesive layer 15, and the insulating film 13 are formed on the rear side of the glass substrate 79. In this step, the second fixed electrode 12 is connected to the extraction electrode 19.

Next, a conductive metal thin film of gold, for example, is preferably formed on the glass substrate 79 by, for example, a sputtering or vapor deposition method. By using the conductive metal thin film, the sealing frame 14 is formed on the rear side of the glass substrate 79 at a portion corresponding to the support frame 67. Then, the bonding film 14A is formed on the rear side of the sealing frame 14. The second substrate 3 including the fixed electrode 12 is formed through the above-described process (refer to FIG. 28).

Figure 28:
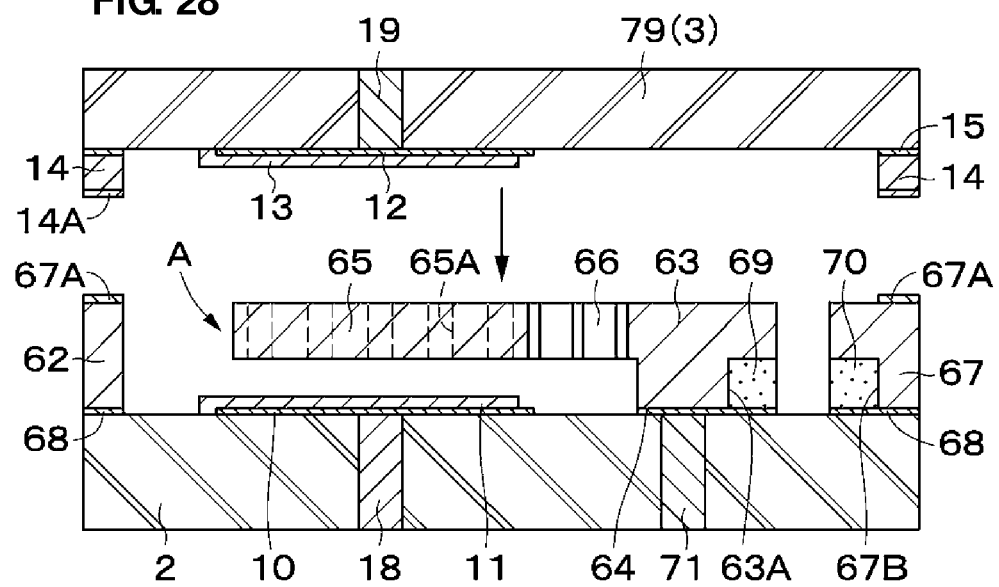
FIG. 28 is a longitudinal sectional view showing a state in which a sealing frame of a second substrate is pressure-bonded to a support frame of an etched layer in a pressure-bonding step.

Next, in a pressure bonding step shown in FIG. 28, as in the pressure-bonding step according to the first preferred embodiment, the sealing frame 14 of the second substrate 3 is thermocompression-bonded to the support frame 67 of the etched layer 62. Consequently, preferably, the bonding films 67A and 14A of the support frame 67 and the sealing frame 14, respectively, are bonded to each other, and the second substrate 3 and the etched layer 62 are bonded and fixed to each other. As a result, the airtight receiving space S is defined between the first and second substrates 2 and 3, and the movable portion 65 is disposed in the receiving space S. In addition, the movable portion 65 is disposed at a position facing the fixed electrodes 10 and 12 of the substrates 2 and 3, respectively, so as to be displaceable in the thickness direction, thereby completing the acceleration sensor 61.

Therefore, in the third preferred embodiment configured as described above, substantially the same operational advantages as in the first preferred embodiment can be obtained.

Figure 29:
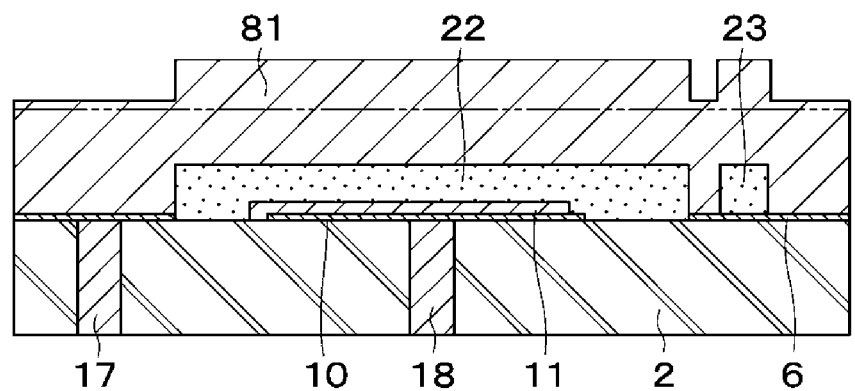
FIG. 29 is a longitudinal sectional view showing a state in which a metal layer is formed on a first substrate to cover first and second sacrificial layers in a metal layer forming step according to a second modified example of a preferred embodiment of the present invention.
Figure 30:
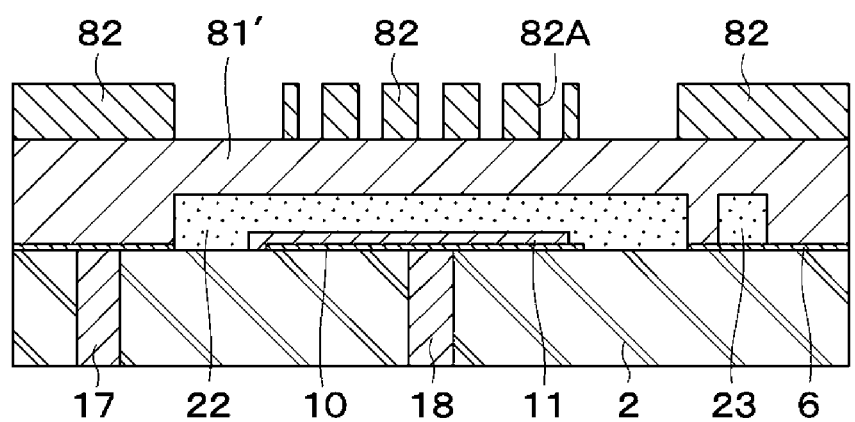
FIG. 30 is a longitudinal sectional view showing a state in which a metal layer is etched in an etching step after surface smoothing according to the second modified example of a preferred embodiment of the present invention.

Each of the preferred embodiments is preferably configured to use a plating method including the seed layer forming step, the plating mold forming step, the metal layer forming step, and the surface smoothing step. That is, each of the preferred embodiments is preferably configured such that the metal layer 26, 56, or 78 is formed by electroplating using the seed layer 24, 54, or 76, and the structure A including the movable portion 7, 37, or 65 and the support frame 9, 39, or 67 as the smooth surface member are formed using the metal layer 26, 56, or 78. However, preferred embodiments of the present invention are not limited to this, and an etching method according to a second modified example, for example, as shown in FIGS. 29 and 30 may be used instead of the above-described four steps. In this case, a metal layer 81 is preferably formed over the entire or substantially the entire surface of the substrate 2 so as to cover the first and second sacrificial layers 22 and 23, and the structure A including the movable portion 7 and the support frame 9 as the smooth surface member are formed by etching the metal layer 81.

Specifically, in a metal layer forming step shown in FIG. 29, the metal layer 81 preferably composed of a conductive metallic material, such as copper, for example, is formed as a member to be etched on the surfaces of the first and second sacrificial layers 22 and 23 by a deposition method, for example, a vapor deposition or sputtering method. As a result, the metal layer 81 is formed on the surface of the substrate 2 to cover the first and second sacrificial layers 22 and 23 so as to be in contact with the first and second sacrificial layers 22 and 23. In this case, in the metal layer 81, a portion which covers the first sacrificial layer 22 and corresponds to the structure A defines a first metal layer. In addition, in the metal layer 81, a portion which covers the second sacrificial layer 23 defines a second metal layer which electrically connects an area corresponding to the movable portion 7 formed of the first metal layer to the second sacrificial layer 23. Then, in the surface smoothing step, the surface of the metal layer 81 is preferably polished to a flat state up to a position shown by a two-dot chain line in FIG. 29 by, for example, a CMP method.

Next, in an etching step shown in FIG. 30, first, a resist pattern 82 composed of a photoresist material is formed on the metal layer 81' after smoothing. In this case, the resist pattern 82 is disposed at portions corresponding to the fixed portion 5, the movable portion 7, and the support beams 8, and openings 82A are formed in the other portions. In this state, the metal layer 81' in the portions corresponding to the openings 82A is removed from the surface of the resist pattern 82 by a wet etching method or dry etching method. As a result, the etched layer 4 including the fixed portion 5, the movable portion 7, the support beams 8, and the support frame 9, which have smoothed surfaces, is formed. In this case, the second sacrificial layer 23 is electrically connected to the movable portion 7 and the support frame 9 through the fixed portion 5 and the adhesive layer 6.

Figure 31:
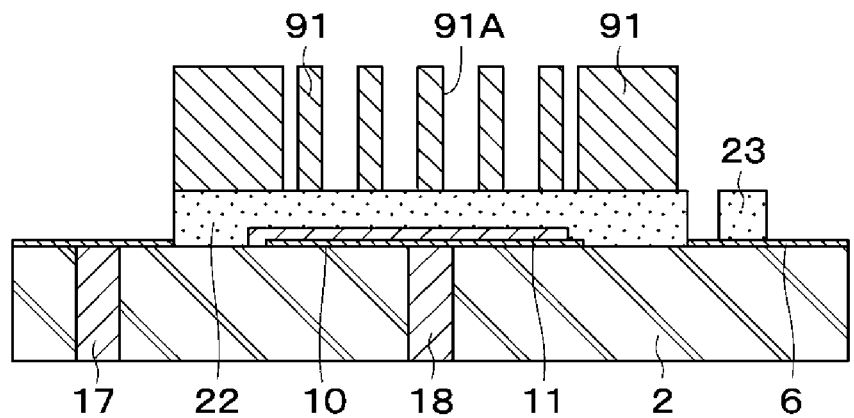
FIG. 31 is a longitudinal sectional view showing a state in which a resist pattern is formed on a first substrate to cover first and second sacrificial layers in a resist pattern forming step according to a third modified example of a preferred embodiment of the present invention.
Figure 32:
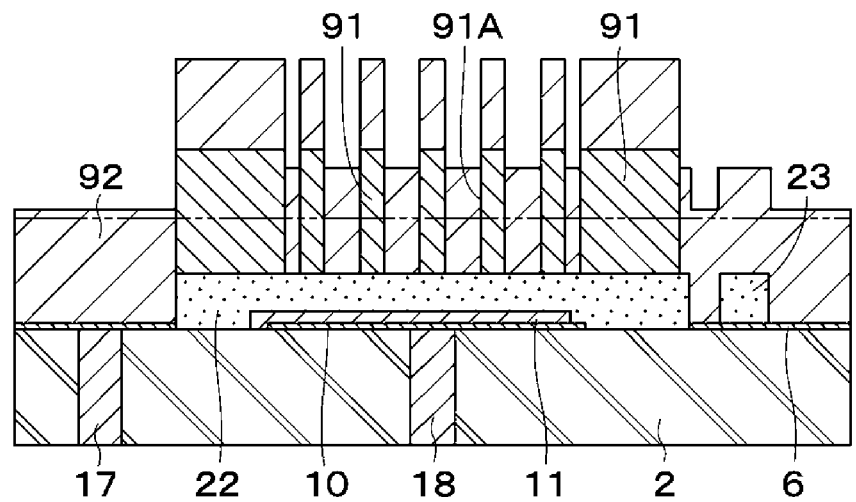
FIG. 32 is a longitudinal sectional view showing a state where a metal layer is formed on a surface of the resist pattern in a metal film forming step according to the third modified example of a preferred embodiment of the present invention.

Further, preferred embodiments of the present invention are not limited to this, and may be configured such that the structure A including the movable portion 7 and the support frame 9 as the smooth surface member are preferably formed by, for example, a liftoff method according to a third modified example shown in FIGS. 31 and 32. In this case, preferably, a resist pattern 91 is formed on the first and second sacrificial layers 22 and 23, and then a metal layer 92 is formed over the entire surface of the substrate 2. Then, the structure A including the movable portion 7 and the support frame 9 as the surface smooth member are formed using the metal layer 92.

Specifically, in a resist pattern forming step shown in FIG. 31, the resist pattern 91 composed of a photoresist material is formed to cover the surfaces of the first and second sacrificial layers 22 and 23. In this case, the resist pattern 91 includes openings 91A in portions corresponding to the fixed portion 5, the movable portion 7, and the support beams 8. The resist pattern 91 need not cover the entire or substantially the entire surface of the substrate 2 and may be formed to cover at least the surfaces of the first and second sacrificial layers 22 and 23.

Next, in a metal layer forming step shown in FIG. 32, the metal layer 92 preferably composed of a conductive metallic material, such as copper, for example, is formed, as a member to be etched, by, for example, a deposition method such as a vapor deposition or sputtering method. Consequently, the metal layer 92 is laminated on the surface of the substrate 2, through the first and second sacrificial layers 22 and 23, so as to be positioned in the openings 91A of the resist pattern 91 and to be in contact with the first and second sacrificial layers 22 and 23. In this case, in the metal layer 92, a portion which covers the first sacrificial layer 22 and corresponds to the structure A defines a first metal layer. In addition, in the metal layer 92, a portion which covers the second sacrificial layer 23 defines a second metal layer.

Then, in a surface smoothing step, the surface of the metal layer 92 is preferably polished to a flat state up to a position shown by a two-dot chain line in FIG. 32 by, for example, a CMP method, and the resist pattern 91 is removed. As a result, the etched layer 4 including the fixed portion 5, the movable portion 7, the support beams 8, and the support frame 9, which includes smoothed surfaces, is formed. In this case, the second sacrificial layer 23 is electrically connected to the movable portion 7 and the support frame 9 through the fixed portion 5 and the adhesive layer 6.

The second and third modified examples are described as preferably being applied to the first preferred embodiment, but can also be applied to the second and third preferred embodiments in substantially the same manner.

In addition, each of the preferred embodiments is configured such that a plurality of through holes 7A, 37A, or 65A are formed in the movable portion 7, 37, or 65 so that the first sacrificial layer 22, 52, or 73 is etched away earlier than the second sacrificial layer 23, 53, or 74 and the third sacrificial layer 75. However, preferred embodiments of the present invention are not limited to this, and, for example, may be configured such that instead of providing the through holes in the movable portion, the opening area of the receiving groove 5A, 35C, 63A, or 67B is decreased to decrease the etching rate of the second sacrificial layer 23, 53, or 73 and the third sacrificial layer 75. In addition, if a sufficient place for disposing the second and third sacrificial layers can be provided, the first sacrificial layer may be configured to be removed early by increasing the area of the second and third sacrificial layers.

In addition, each of the preferred embodiments is preferably configured such that the etching rates of the first sacrificial layer 22, 52, or 73, the second sacrificial layer 23, 53, or 73, and the third sacrificial layer 75 are controlled by determining the etching solution contact area of the first sacrificial layer to a value different from those of the second and third sacrificial layers. However, preferred embodiments of the present invention are not limited to this and may be configured such that the etching rates of the first sacrificial layer and the second and third sacrificial layers are controlled by forming the first sacrificial layer using a material having a different ionization tendency from those of the second and third sacrificial layers. In this case, the first sacrificial layer is preferably formed using a higher ionization tendency than those of the second and third sacrificial layers. Consequently, the first sacrificial layer is corroded to a greater extent than the second and third sacrificial layers, and thus the first sacrificial layer can be etched away early.

In addition, each of the preferred embodiments is preferably configured such that the structure A including the fixed portion 5, 35, or 63, the movable portion 7, 37, or 65, and the support beams 8, 38, or 66, and the support frame 9, 39, or 67 are preferably formed by using gold, copper, or other suitable material, for example. However, platinum (Pt), silver (Ag), or other suitable materials may be used as long as the material has a lower ionization tendency than those of the second and third sacrificial layers 23, 53, or 74 and 75 (remaining sacrificial layer 16, 46, 69, or 70).

In addition, each of the preferred embodiments is configured such that the structure A and the support frame 9, 39, or 67 are formed by using the common metal layer 26, 56, or 78. However, the structure and the support frame may be formed using respective metal layers. In this case, the structure and the support frame may be formed using different materials.

In addition, each of the preferred embodiments is configured such that the first to third sacrificial layers 22 and 23, 52 and 53, or 73 to 75 are preferably covered with the common metal layer 26, 56, or 78. However, preferred embodiments of the present invention are not limited to this and may be configured such that the first to third sacrificial layers may be independently covered with first to third metal layers, respectively. In this case, the first to third metal layers may be formed using different materials.

In addition, each of the preferred embodiments is configured such that the remaining sacrificial layer 16, 46, or 69 is preferably covered with the fixed portion 5, 35, or 63 of the structure A. However, preferred embodiments of the present invention are not limited to this and may be configured such that, for example, a separate coating fixed portion independent of the structure A is arranged on the first substrate 2 so as to cover the remaining sacrificial layer by the coating fixed portion. In this case, the remaining sacrificial layer including the second sacrificial layer may be electrically connected to the structure A.

Further, the third preferred embodiment is configured such that the second and third sacrificial layers 74 and 75 preferably are separately formed. However, the second and third sacrificial layers may be integrally formed to be connected to each other. In addition, the second and third sacrificial layers 74 and 75 may be formed using the same material, or may be formed using different materials.

In addition, in each of the preferred embodiments, the metal layer 26, 56, or 78 is preferably formed by plating. However, the metal layer may be formed by another deposition method, such as a liquid-phase growth method, a vapor-phase growth method, a sputtering method, or a vapor deposition method. Further, in each of the preferred embodiments, the movable portions 7, 37, or 65 are preferably formed from the metal layer 26, 56, or 78 by removing the plating mold 25, 55, or 77. However, the movable portions may be formed by other forming methods, such as etching or other suitable forming method, for example.

In addition, each of the preferred embodiments is preferably configured such that the metal layer 26, 56, or 78 is preferably provided as the member to be etched to cover the entire surface of the first sacrificial layer 22, 52, or 73. However, preferred embodiments of the present invention are not limited to this and may be configured such that for example, the member to be etched is disposed on the side and back surfaces of the first sacrificial layer as long as at least a portion of the first sacrificial layer contacts the member to be etched. Alternatively, the first sacrificial layer may be disposed on the surface of the member to be etched on the side opposite to the first substrate.

In addition, each of the preferred embodiments is preferably configured such that the movable portion 7, 37, or 65 which can be displaced in the thickness direction of the substrate 2 or 32, the support beams 8, 38, or 66, are formed as the structure. However, preferred embodiments of the present invention are not limited to this and may be configured such that the movable portion which can be displaced in a horizontal direction parallel or substantially parallel to the substrate may be formed as the structure or an electrode fixed to the substrate etc. may be formed as the structure.

In addition, the first and third preferred embodiments are preferably configured by providing the fixed electrodes 10 and 12 on the first and second substrates 2 and 3, respectively. However, preferred embodiments of the present invention may be configured by providing a fixed electrode on only one of the first and second substrates 2 and 3. Similarly, the second preferred embodiment is configured preferably by providing the driving electrode 43 as the fixed electrode on the first substrate 32 and providing the signal electrodes 40 as the fixed electrodes on the second substrate 33. However, preferred embodiments of the present invention may be configured by providing both the signal electrode and the driving electrode on any one of the first and second substrates 32 and 33.

Further, in each of the preferred embodiments, the acceleration sensor 1 or the switching element 31 is described as an example of the MEMS element. However, preferred embodiments of the present invention are not limited to this, and can be widely applied to various elements manufactured by fine processing using a sacrificial layer, for example, an actuator, a relay element, an angular velocity sensor, a variable-capacitance element, and other suitable elements.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A MEMS element comprising:
   a substrate;
   a smooth surface member provided on the substrate and including a smooth surface; and
   a structure provided on the substrate and disposed in contact with a first sacrificial layer; wherein
   the first sacrificial layer is capable of being entirely etched away by an etchant that corrodes the smooth surface member;
   a second sacrificial layer is arranged on the substrate so as to be electrically connected to the smooth surface member, the second sacrificial layer having a higher ionization tendency than that of the smooth surface member so as to be capable of being preferentially etched away as compared to the smooth surface member; and
   a portion of the second sacrificial layer remains are the first sacrificial layer has been entirely etched away.

2. The MEMS element according to claim 1, wherein a cover is provided on the smooth surface member so as to cover a structure thereof.

3. A MEMS element comprising:
   a substrate;
   a structure in which a fixed portion fixed to the substrate and a movable portion spaced from the substrate are connected to each other through a support beam; and
   a smooth surface member including a smooth surface and provided on the substrate at a position different from that of the structure; wherein the structure includes a metal layer laminated on the substrate with a first sacrificial layer provided therebetween, and the first sacrificial layer is capable of being entirely etched away;

a second sacrificial layer and a third sacrificial layer are provided on the substrate so that the second sacrificial layer is electrically connected to the structure, and the third sacrificial layer is electrically connected to the smooth surface member, the second sacrificial layer having a higher ionization tendency than that of the structure and being capable of being preferentially etched away as compared to the structure and the third sacrificial layer having a higher ionization tendency than that of the smooth surface member and being capable of being preferentially etched away compared to the smooth surface member; and portions of each of the second and the third sacrificial layers partially remain after the first sacrificial layer has been entirely etched away.

* * * * *